United States Patent
Jang et al.

(10) Patent No.: US 12,016,176 B2
(45) Date of Patent: Jun. 18, 2024

(54) SEMICONDUCTOR MEMORY DEVICE AND METHOD FOR FABRICATING THE SAME

(71) Applicant: Samsung Electronics Co., Ltd., Suwon-si (KR)

(72) Inventors: Hyeon-Woo Jang, Hwaseong-si (KR); Soo Ho Shin, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 50 days.

(21) Appl. No.: 17/368,130

(22) Filed: Jul. 6, 2021

(65) Prior Publication Data
US 2022/0189966 A1 Jun. 16, 2022

(30) Foreign Application Priority Data
Dec. 11, 2020 (KR) .................. 10-2020-0173585

(51) Int. Cl.
*H10B 12/00* (2023.01)

(52) U.S. Cl.
CPC ......... *H10B 12/50* (2023.02); *H10B 12/0335* (2023.02); *H10B 12/09* (2023.02); *H10B 12/315* (2023.02); *H10B 12/34* (2023.02)

(58) Field of Classification Search
CPC .. H10B 12/0335; H10B 12/09; H10B 12/315; H10B 12/34; H10B 12/50
See application file for complete search history.

(56) References Cited

U.S. PATENT DOCUMENTS

| | | | |
|---|---|---|---|
| 6,140,176 A | 10/2000 | jenq | |
| 6,756,262 B1 | 6/2004 | Nakamura et al. | |
| 7,084,027 B2 | 8/2006 | Hilliger et al. | |
| 9,379,004 B1 | 6/2016 | Kwon et al. | |
| 9,548,300 B2 | 1/2017 | Kim | |
| 10,559,569 B2 | 2/2020 | Jang et al. | |
| 2011/0049600 A1* | 3/2011 | Aoki ............... | H10B 12/50 438/386 |
| 2018/0166529 A1 | 6/2018 | Park et al. | |

FOREIGN PATENT DOCUMENTS

KR 101824735 B1 2/2018

* cited by examiner

*Primary Examiner* — Meiya Li
(74) *Attorney, Agent, or Firm* — Harness, Dickey & Pierce, P.L.C.

(57) ABSTRACT

A semiconductor memory device comprises a substrate which includes a cell region, and a peri region defined around the cell region, the cell region including an active region defined by an element separation film, a storage pad connected to the active region of the cell region, a peri gate structure placed on the substrate of the peri region, a peri contact plug placed on both sides of the peri gate structure and connected to the substrate, a first interlayer insulating film which is placed on the storage pad and the pen contact plug, and includes a nitride-based insulating material, and an information storage unit connected to the storage pad, wherein a thickness of the first interlayer insulating film on an upper surface of the storage pad is smaller than a thickness of the first interlayer insulating film on an upper surface of the peri contact plug.

19 Claims, 32 Drawing Sheets

SEMICONDUCTOR MEMORY DEVICE AND METHOD FOR FABRICATING THE SAME

CROSS-REFERENCE TO RELATED APPLICATION

This application claims priority from Korean Patent Application No. 10-2020-0173585 filed on Dec. 11, 2020 in the Korean Intellectual Property Office, and all the benefits accruing therefrom under 35 U.S.C. § 119, the contents of which in its entirety are herein incorporated by reference.

BACKGROUND

Some example embodiments relate to a semiconductor memory device and/or a method for fabricating the same, and more specifically, to a semiconductor memory device provided with a plurality of wiring lines and buried contacts that intersect each other, and/or a method for fabricating the same.

As semiconductor elements are increasingly highly integrated, individual circuit patterns become further finer to implement more semiconductor elements in the same area. For example, as the degree of integration of the semiconductor elements increases, the design rules of the components of the semiconductor element decrease and/or become more complicated.

In highly scaled semiconductor elements, a process of forming a plurality of wiring lines and a plurality of buried contacts (BC) interposed between them becomes increasingly complicated and/or difficult.

SUMMARY

Some example embodiments provide a semiconductor memory device capable of improving reliability and performance.

Alternatively or additionally, some example embodiments also provide a method for fabricating a semiconductor memory device capable of improving reliability and performance.

However, aspects of some example embodiments are not restricted to the one set forth herein. The and other aspects of some example embodiments will become more apparent to one of ordinary skill in the art to which example embodiments pertains by referencing the detailed description of example embodiments given below.

According to some example embodiments, there is provided a semiconductor device including a substrate including a cell region and a peri region around the cell region, the cell region including an active region defined by an element separation film, a storage pad connected to the active region of the cell region, a peri gate structure on the substrate of the peri region, a peri contact plug on both sides of the peri gate structure and connected to the substrate, a first interlayer insulating film on the storage pad and on the peri contact plug, and including a nitride-based insulating material, and an information storage circuit connected to the storage pad. A thickness of the first interlayer insulating film on an upper surface of the storage pad is less than a thickness of the first interlayer insulating film on an upper surface of the peri contact plug.

According to some example embodiments, there is provided a semiconductor device including a substrate including a cell region and a peri region around the cell region, the cell region including an active region defined by an element separation film, a cell separation film defining the cell region in the substrate, a storage pad connected to the active region of the cell region, a peri gate structure on the substrate of the peri region, a peri contact plug on both sides of the peri gate structure and connected to the substrate, an upper surface of the peri contact plugs on a same plane as an upper surface of the storage pad, a first interlayer insulating film on the storage pad and on the peri contact plug and including a nitride-based insulating material, and a capacitor including a lower electrode connected to the storage pad, a capacitor dielectric film on the lower electrode, and a plate upper electrode on the capacitor dielectric film. An upper surface of the first interlayer insulating film includes a step structure on the cell separation film.

According to some example embodiments, there is provided a semiconductor device including a substrate including a cell region, and a peri region around the cell region, the cell region including an active region defined by an element separation film, a cell separation film defining the cell region of the substrate, a bit line structure including a cell conductive line and a cell line capping film on the cell conductive line, the bit line structure on the substrate of the cell region, a cell gate electrode placed inside the substrate of the cell region and intersecting the cell conductive line, a storage pad on a side surface of the bit line structure and connected to the active region of the cell region, a peri gate structure on the substrate of the peri region, a peri contact plug on both sides of the peri gate structure and connected to the substrate, a capacitor including a lower electrode connected to the storage pad, a capacitor dielectric film on the lower electrode, and a plate upper electrode on the capacitor dielectric film, a lower interlayer insulating film which on the peri contact plug and including a nitride-based insulating material, a termination of the lower interlayer insulating film covered with the plate upper electrode, and an upper interlayer insulating film on the lower interlayer insulating film and covering side walls of the plate upper electrode. The lower interlayer insulating film is not on the upper surface of the storage pad.

According to some example embodiments, there is provided a method for fabricating a semiconductor memory device, the method including providing a substrate which includes a cell region and a peri region around the cell region, forming a cell gate electrode in the substrate of the cell region, forming a bit line structure including a cell conductive line and a cell line capping film on the cell conductive line, the bit line structure on the substrate of the cell region, forming a peri gate structure including a peri gate conductive film and a peri gate capping film on the peri gate conductive film, the peri gate structure on the substrate of the peri region, forming a storage pad on side surfaces of the bit line structure, forming a peri contact plug on both sides of the peri gate structure, the peri contact plug being formed simultaneously with the storage pad, forming a pre lower interlayer insulating film covering an upper surface of the peri contact plug and an upper surface of the storage pad, removing a part of the pre lower interlayer insulating film to form a lower interlayer insulating film that exposes the upper surface of the storage pad, the lower interlayer insulating film covering the upper surface of the peri contact plug, forming an etching stop film covering the cell region and the peri region, the etching stop film on the lower interlayer insulating film, and forming a lower electrode penetrating the etching stop film and connected to the storage pad.

BRIEF DESCRIPTION OF THE DRAWINGS

The and other aspects and features of some example embodiments will become more apparent by describing in detail some example embodiments thereof with reference to the attached drawings, in which.

DETAILED DESCRIPTION OF SOME EXAMPLE EMBODIMENTS

Figure 1:
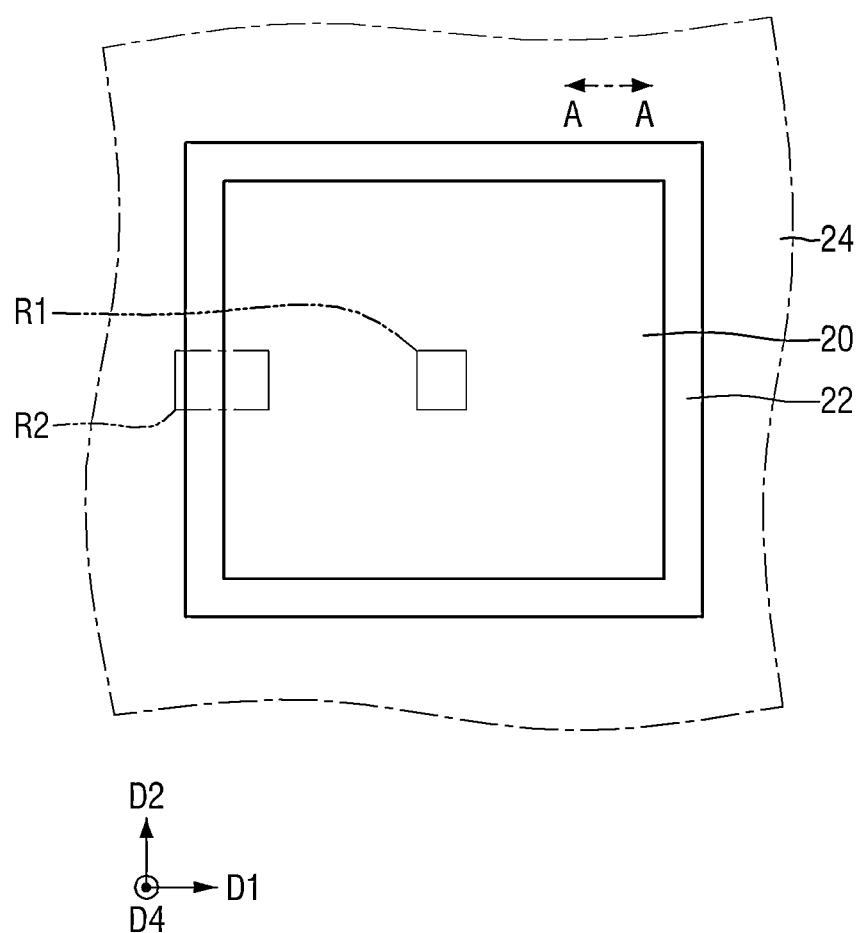
FIG. 1 is schematic layout diagram of a semiconductor memory device according to some example embodiments.
Figure 2:
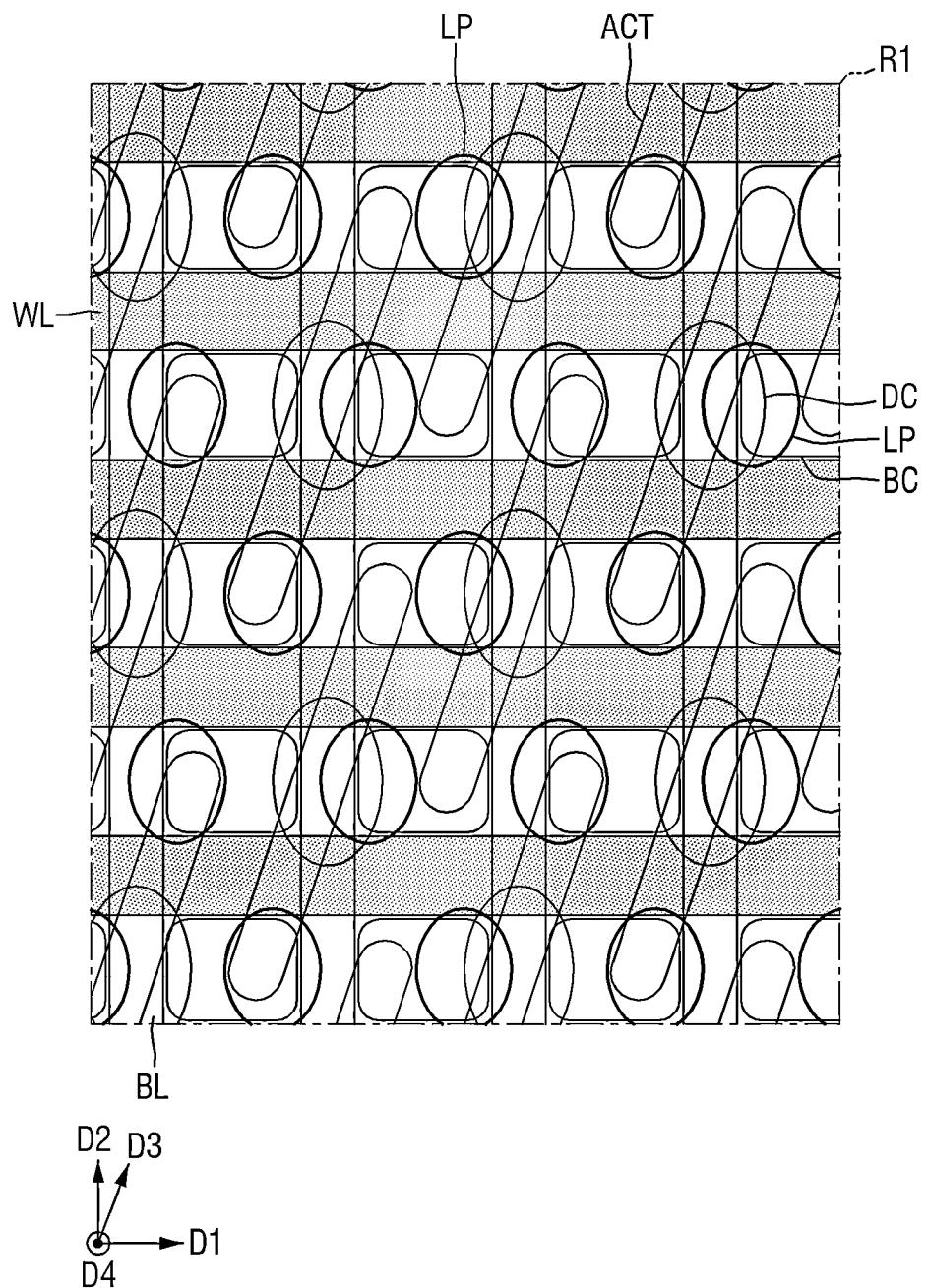
FIG. 2 is a schematic layout diagram of a region R1 of FIG. 1.
Figure 3:
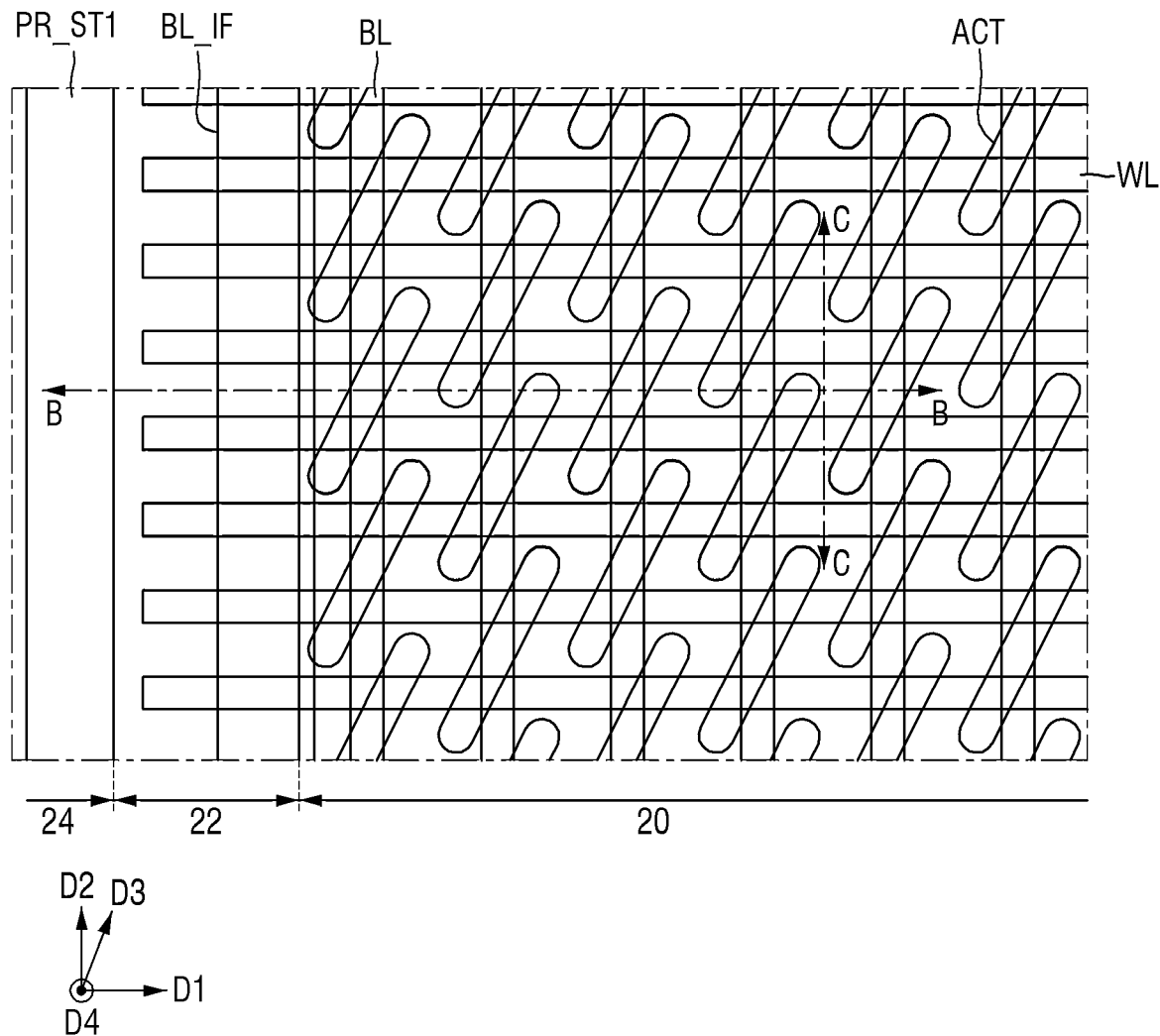
FIG. 3 is a schematic layout diagram of a region R2 of FIG. 1.
Figure 4A:
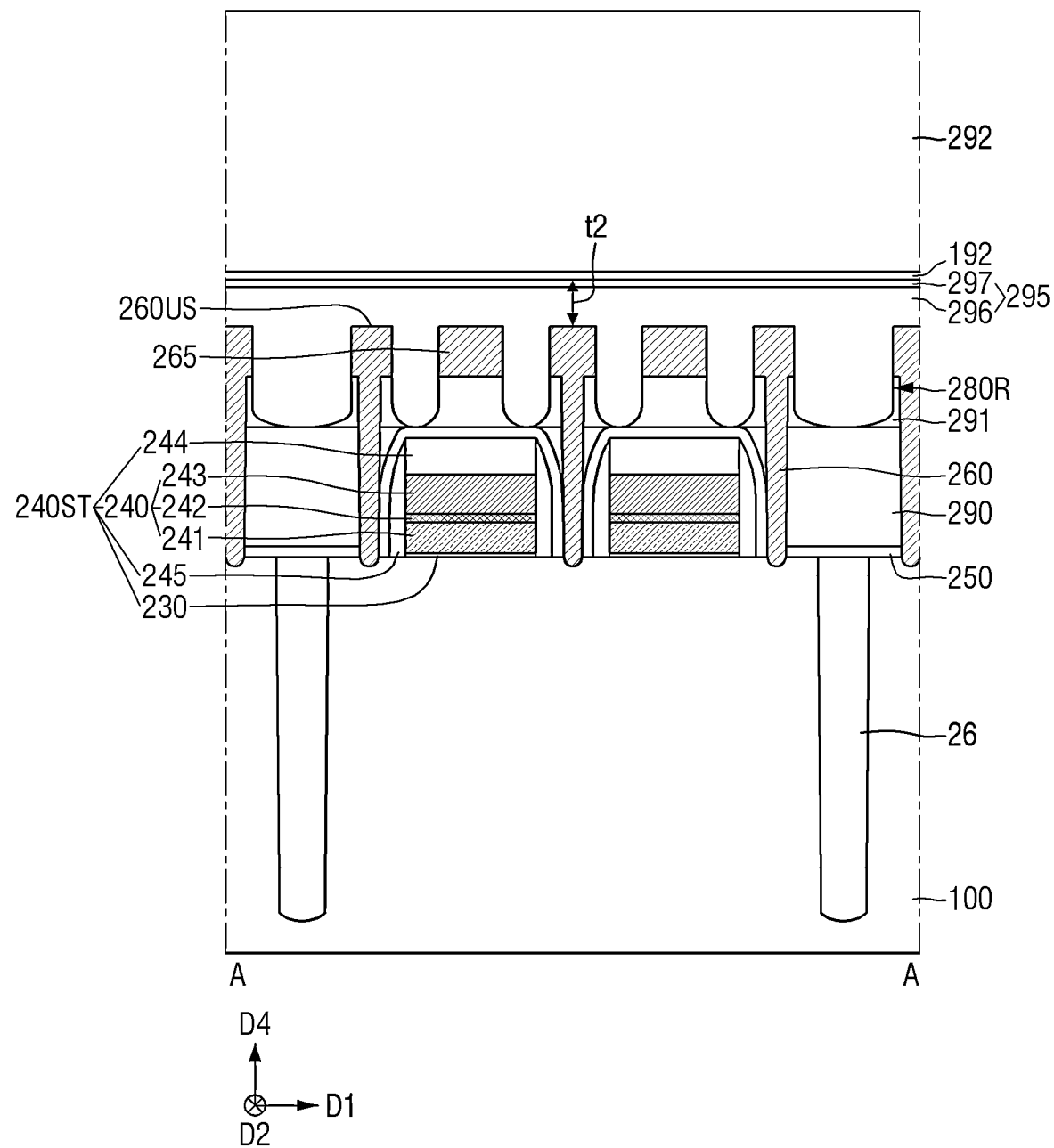
FIGS. 4A and 4B are example cross-sectional views taken along A-A of FIG. 1.
Figure 4B:
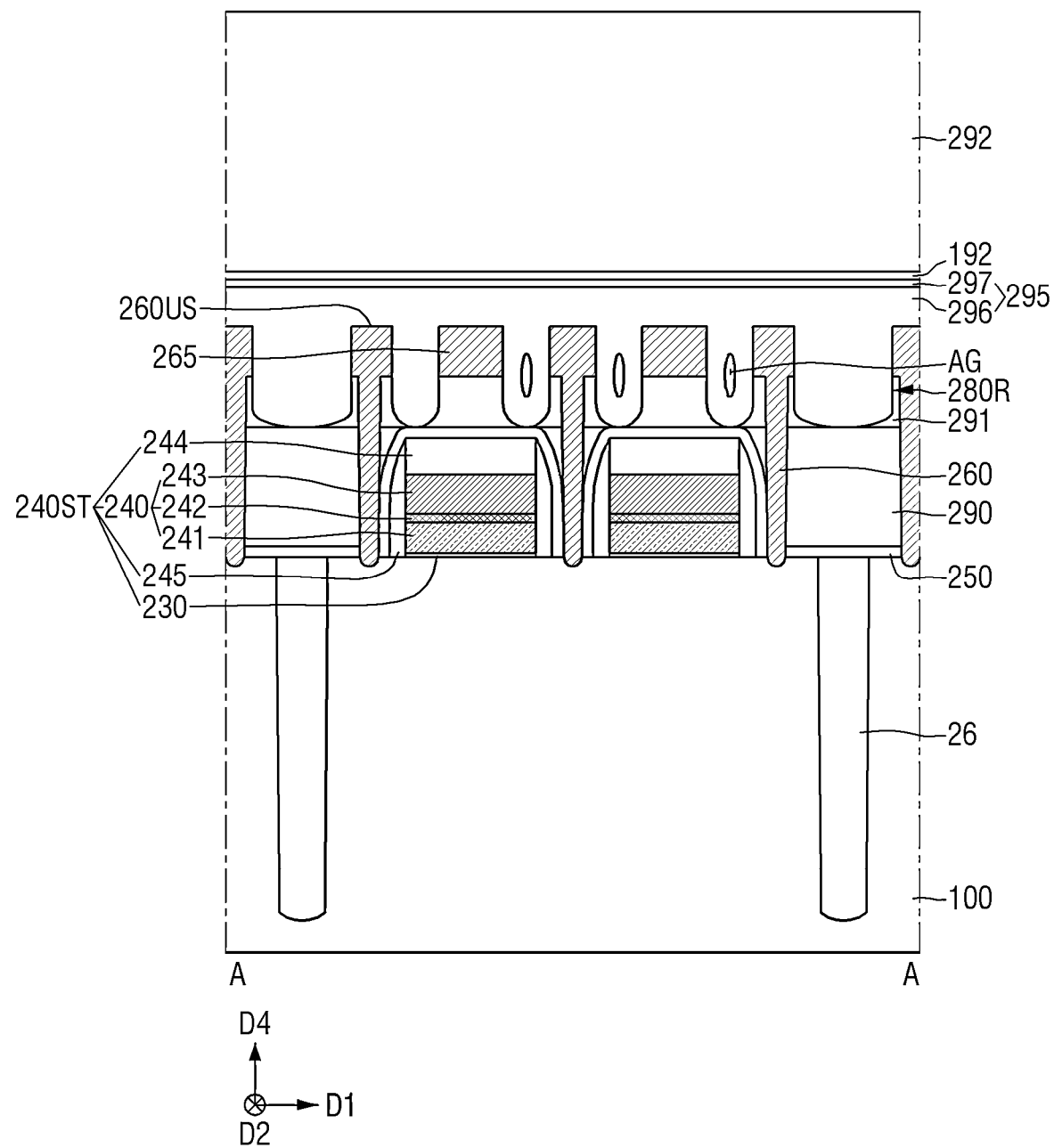
Figure 5:
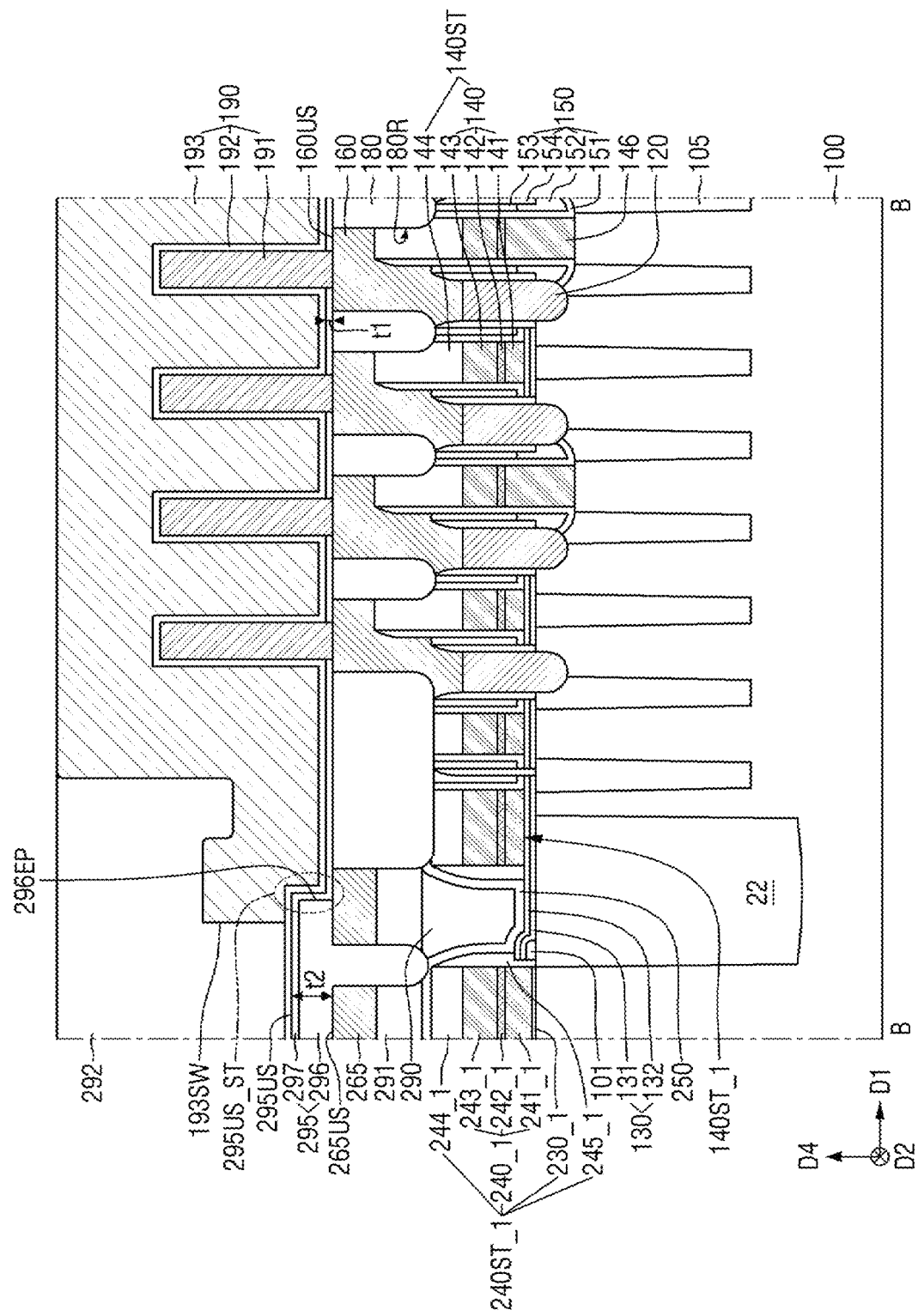
FIG. 5 is a cross-sectional view taken along B-B of FIG. 3.
Figure 6:
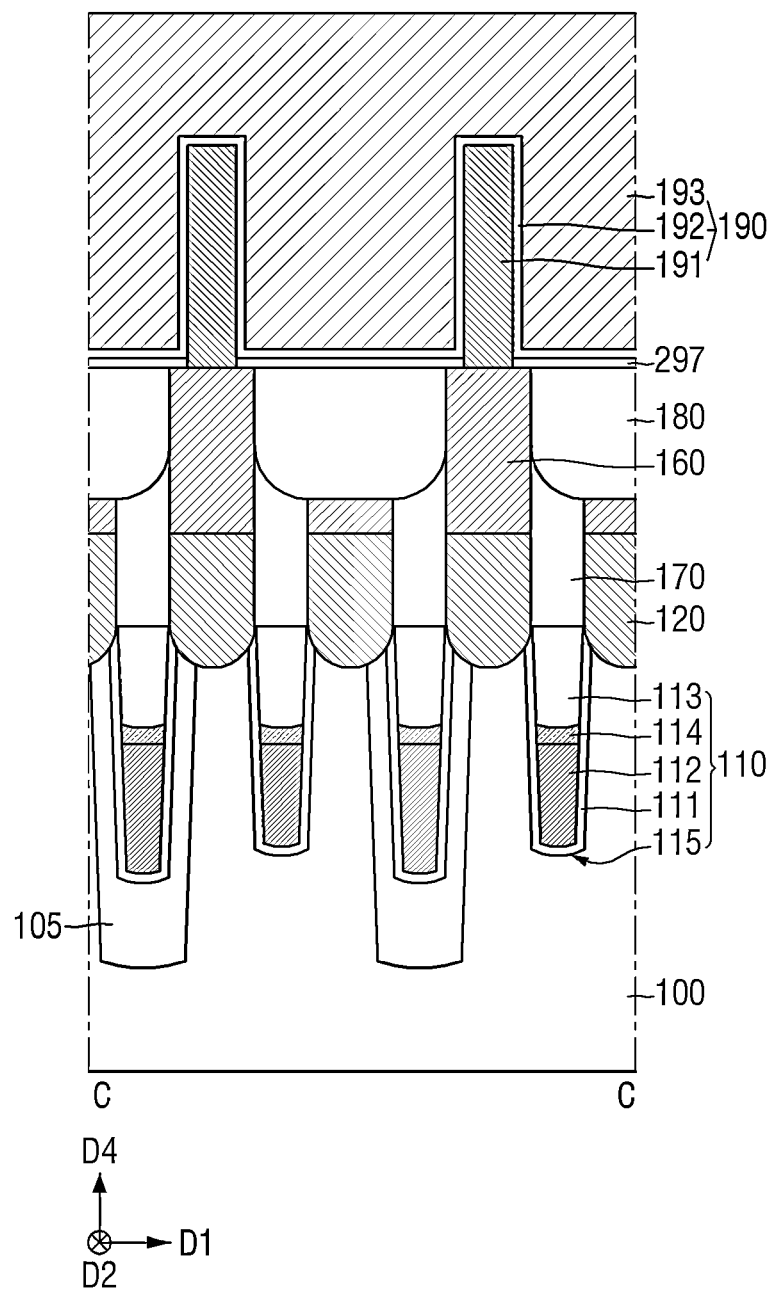
FIG. 6 is a cross-sectional view taken along C-C of FIG. 3.

FIG. 1 is a schematic layout diagram of a semiconductor memory device according to some example embodiments. FIG. 2 is a schematic layout of a region R1 of FIG. 1. FIG. 3 is a schematic layout diagram of a region R2 of FIG. 1. FIGS. 4A and 4B are example cross-sectional views taken along A-A of FIG. 1. FIG. 5 is a cross-sectional view taken along B-B of FIG. 3. FIG. 6 is a cross-sectional view taken along C-C of FIG. 3.

For reference, FIGS. 4A and 4B may be example cross-sectional views of a transistor formation region of a peripheral circuit/peripheral logic region (herein referred to as a peri region).

In the drawings relating to the semiconductor memory device according to some example embodiments, although a DRAM (Dynamic Random Access Memory) is shown as an example, example embodiments are not limited thereto.

Referring to FIGS. 1 to 3, the semiconductor memory device according to some example embodiments may include a cell region 20, a cell region separation film 22, and a peri region 24.

The cell region separation film 22 may be formed along the periphery/boundary of the cell region 20. The cell region separation film 22 may separate the cell region 20 and the peri region 24. The peri region 24 may be defined around the cell region 20.

The cell region 20 may include a plurality of cell active regions ACT. The cell active region ACT may be defined by a cell element separation film (105 of FIGS. 5 and 6) formed in/within a substrate (100 of FIG. 4). With the reduction of design rules of the semiconductor memory devices, the cell active region ACT may be placed in the form of a bar of diagonal line (or oblique line) as shown. For example, the cell active region ACT may extend in a third direction D3. The third direction may be at angle with a first direction D1 of about 70 degrees; however, example embodiments are not limited thereto.

A plurality of gate electrodes may be placed in the first direction D1 across the cell active region ACT. The plurality of gate electrodes may extend to be parallel to each other. The plurality of gate electrodes may be or correspond to, for example, a plurality of rows/plurality of word lines WL. The word lines WL may be placed at equal intervals. A width of the word line WL, a pitch of word lines WL, and/or an interval between the word lines WL may be determined depending on the design rules.

Each cell active region ACT may be divided into three portions by two word lines WL extending in the first direction D1. The cell active region ACT may include a storage connection region and a bit line connection region. The bit line connection region may be located at the center of the cell active region ACT, and the storage connection region may be located at the end portion of the cell active region ACT. Although the cell active regions ACT are illustrated as oblique bars, example embodiments are not limited thereto. For example, the cell active regions ACT may include or may have extensions, e.g. wings, in a center of each cell active region ACT.

A plurality of columns/a plurality of bit lines BL extending in a second direction D2 orthogonal to the word line WL may be placed on the word line WL. The plurality of bit lines BL may extend to be parallel to each other. The bit lines BL may be placed at equal intervals. A width of the bit line BL and/or a pitch of neighboring bit lines BL and/or an interval between the bit lines BL may be determined depending on the design rules.

A boundary bit line BL_IF may extend in the second direction D2 alongside the bit line BL. At least a part of the boundary bit line BL_IF may be placed to overlap the cell region separation film 22 in the first direction D1. Unlike the shown configuration, the semiconductor memory device according to some example embodiments may not include the boundary bit line BL_IF. Furthermore there may be dummy bit lines (not illustrated) and/or dummy active regions (not illustrated) and/or dummy word lines (not illustrated) within a cell region 20.

A boundary peri gate PR_ST1 may extend in the second direction D2 alongside the boundary bit line BL_IF. The boundary peri gate PR_ST1 may be placed at the boundary between the cell region separation film 22 and the peri region 24. Unlike the shown configuration, in the semiconductor memory device according to some example embodiments, the boundary peri gate PR_ST1 may extend in the first direction D1. Also, the semiconductor memory device according to some example embodiments may not or may not include either or both of the boundary bit line BL_IF or the boundary peri gate PR_ST1.

The semiconductor memory device according to some example embodiments may include various contact arrangements formed on the cell active region ACT. Various contact arrangements may include, for example, a digit line contact or direct contact DC, a buried contact BC, and a landing pad LP.

Here, the direct contact DC may refer to a contact that electrically connects the cell active region ACT to the bit line BL. The buried contact BC may refer to a contact that connects the cell active region ACT to a lower electrode (191 of FIGS. 5 and 6) of the capacitor. A contact area between the buried contact BC and the cell active region ACT may be small in view of the arrangement structure. Accordingly, a conductive landing pad LP may be introduced to enlarge the contact area with the cell active region ACT and enlarge the contact area with the lower electrode (191 of FIGS. 5 and 6) of the capacitor. There may be a reduction in contact resistance by inclusion of the conductive landing pad LP.

The landing pad LP may be placed between the cell active region ACT and the buried contact BC, and may be placed between the buried contact BC and the lower electrode (191 of FIGS. 5 and 6) of the capacitor. In the semiconductor memory device according to some example embodiments, the landing pad LP may be placed between the buried contact BC and the lower electrode of the capacitor. By enlarging the contact area through the introduction of the landing pad LP, a contact resistance between the cell active region ACT and the lower electrode of the capacitor may be reduced, which may lead to improved sensing margins and/or improved performance of the semiconductor device.

The direct contact DC may be connected to a bit line connection region. The buried contact BC may be connected to the storage connection region. As the buried contacts BC are placed at both end portions of the cell active region ACT, the landing pads LP may be placed to partially overlap the buried contacts BC to be adjacent to both ends of the cell active region ACT. Alternatively or additionally, the buried contact BC may be formed to overlap the cell active region ACT and the cell element separation film (105 of FIGS. 5 and 6) located between the adjacent word lines WL and between the adjacent bit lines BL.

The word line WL may be formed as a buried structure inside the substrate 100. The word line WL may be placed across the cell active region ACT between the direct contact DC and the buried contact BC. As shown, two word lines WL may be placed to cross the single cell active region ACT. Since the cell active region ACT extends along a third direction D3, the word line WL may have an angle of less than 90 degrees with the cell active region ACT.

The direct contact DC and the buried contact BC may be placed symmetrically. Therefore, the direct contact DC and the buried contact BC may be placed on a straight line, e.g. may be placed collinearly, along the first direction D1 and the second direction D2. On the other hand, unlike the direct contact DC and the buried contact BC, the landing pad LP may be placed in a zigzag shape in the second direction D2 along which the bit line BL extends. Further, the landing pad LP may be placed to overlap the same side surface portion of each bit line BL in the first direction D1 along which the word line WL extends. For example, each of the landing pads LP of the first line overlaps the left side surface of the corresponding bit line BL, and each of the landing pads LP of the second line may overlap the right side surface of the corresponding bit line BL.

Referring to FIGS. 1-3, 4A, 4B, 5 and 6, the semiconductor memory device according to some example embodiments may include a plurality of cell gate structures 110, a plurality of bit line structures 140ST, a plurality of storage pads 160, an information storage unit 190, a peri gate structure 240ST, and a peri gate plug 260.

The substrate 100 may include a cell region 20, a cell region separation film 22, and a peri region 24. The substrate 100 may be or may include a single-crystal semiconductor substrate such as a silicon substrate or an SOI (silicon-on-insulator). In contrast, the substrate 100 may include, but is not limited to, silicon germanium, SGOI (silicon germanium on insulator), indium antimonide, lead telluriume compounds, indium arsenic, indium phosphide, gallium arsenide or gallium antimonide. The substrate 100 may be doped, e.g. maybe lightly doped with boron; however, example embodiments are not limited thereto.

The plurality of cell gate structures 110, the plurality of bit line structures 140ST, the plurality of storage pads 160, and the information storage circuit/unit 190 may be placed in the cell region 20. The peri gate structure 240ST and the peri gate plug 260 may be placed in the peri region 24.

The cell element separation film 105 may be formed inside the substrate 100 of the cell region 20. The cell element separation film 105 may have an STI (shallow trench isolation) structure having excellent/sufficient element separation characteristics. The cell element separation film 105 may define a cell active region ACT inside the cell region 20. The cell active region ACT defined by the cell element separation film 105 may have a long island shape including a short axis and a long axis, as shown in FIG. 1. The cell active region ACT may have an oblique line form to have an angle of less than 90 degrees with respect to the word line WL formed in the cell element separation film 105. Further, the cell active region ACT may have an oblique line form to have an angle of less than 90 degrees with respect to the bit line BL formed on the cell element separation film 105.

The cell region separation film 22 may form a cell boundary separation film having an STI structure. The cell region 20 may be defined by the cell region separation film 22.

The cell element separation film 105 and the cell region separation film 22 may include, but are not limited to, for example, at least one of a silicon oxide film, a silicon nitride film, and a silicon oxynitride film. Although FIGS. 5 and 6 show that the cell element separation film 105 and the cell region separation film 22 are each formed as a single insulating film, this is only for convenience of explanation, and example embodiments are not limited thereto. The cell element separation film 105 and the cell region separation film 22 may be each formed as a single insulating film, and may be formed as a plurality of insulating films, depending on the widths of the cell element separation film 105 and the cell region separation film 22. Furthermore a depth of the cell region separation film 22 may be deeper than a depth of each of the cell element separation film 105; however, example embodiments are not limited thereto.

Although FIG. 5 shows that the upper surface of the cell element separation film 105, the upper surface of the substrate 100, and the upper surface of the cell region separation film 22 are placed on the same plane, this is only for convenience of explanation, and example embodiments are not limited thereto.

The cell gate structure 110 may be formed in the substrate 100 and the cell element separation film 105. The cell gate structure 110 may be formed across the cell element separation film 105 and the cell active region ACT defined by the cell element separation film 105. The cell gate structure 110 may include a cell gate trench 115, a cell gate insulating film 111, a cell gate electrode 112, a cell gate capping pattern 113, and a cell gate capping conductive film 114 which are formed inside the substrate 100 and the cell element separation film 105. Here, the cell gate electrode 112 may be or correspond to the word line WL. Unlike the shown configuration, the cell gate structure 110 may not include the cell gate capping conductive film 114.

The cell gate insulating film 111 may serve as a dielectric for a transistor corresponding to a cell. The cell gate insulating film 111 may extend along the side walls and bottom surface of the cell gate trench 115. The cell gate insulating film 111 may extend along at least a partial profile of the cell gate trench 115. The cell gate insulating film 111 may include, for example, at least one of silicon oxide, silicon nitride, silicon oxynitride, or a high dielectric constant material having a higher dielectric constant than silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The cell gate electrode 112 may serve as a gate for the transistor corresponding to the cell. The cell gate electrode 112 may be formed on the cell gate insulating film 111. The cell gate electrode 112 may fill a part of the cell gate trench 115. The cell gate capping conductive film 114 may extend along the upper surface of the cell gate electrode 112.

The cell gate electrode 112 may include at least one of metal, metal alloy, conductive metal nitride, conductive metal carbonitride, conductive metal carbide, metal silicide, doped semiconductor material such as doped polysilicon, conductive metal oxynitride and conductive metal oxide. The cell gate electrode 112 may include, but is not limited to, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx and combinations thereof. The cell gate capping conductive film 114 may include, but is not limited to, for example, polysilicon or polysilicon-germanium.

The cell gate capping pattern 113 may be placed on the cell gate electrode 112 and the cell gate capping conductive film 114. The cell gate capping pattern 113 may fill the cell gate trench 115 that is left after the cell gate electrode 112 and the cell gate capping conductive film 114 are formed. Although the cell gate insulating film 111 is shown to extend along the side walls of the cell gate capping pattern 113, example embodiments are not limited thereto. The cell gate capping pattern 113 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

Although not shown, at least one impurity doping region may be formed on at least one side of the cell gate structure 110. The impurity doping region may include an impurity such as at least one of arsenic or phosphorus; however, example embodiments are not limited thereto. The impurity doping region may serve a source/drain region of the transistor.

The bit line structure 140ST may correspond to a drain (or a source) of the transistor corresponding to the cell. The bit line structure 140ST may include a cell conductive line 140 and a cell line capping film 144. The cell conductive line 140 may be formed on the substrate 100 and the cell element separation film 105 on which the cell gate structure 110 is formed. The cell conductive line 140 may intersect the cell element separation film 105 and the cell active region ACT defined by the cell element separation film 105. The cell conductive line 140 may be formed to intersect the cell gate structure 110. Here, the cell conductive line 140 may correspond to the bit line BL.

The cell conductive line 140 may be or may include multiple films. The cell conductive line 140 may include, for example, a first cell conductive film 141, a second cell conductive film 142, and a third cell conductive film 143. The first to third cell conductive films 141, 142, and 143 may be sequentially stacked on the substrate 100 and the cell element separation film 105. Although the cell conductive line 140 is shown as triple films, example embodiments are not limited thereto, and there may be more than, or less than, three films included in the cell conductive line 140.

The first to third cell conductive films 141, 142, and 143 may include, for example, at least one of an impurity-doped semiconductor material such as doped polysilicon, a conductive silicide compound, a conductive metal nitride, a metal, and a metal alloy, respectively. For example, the first cell conductive film 141 includes a doped semiconductor material such as doped polysilicon, the second cell conductive film 142 includes at least one of a conductive silicide compound and a conductive metal nitride, and the third cell conductive film 143 may include, but is not limited to, at least one of a metal and a metal alloy.

The bit line contact 146 may be formed between the cell conductive line 140 and the substrate 100. For example, the cell conductive line 140 may be formed on the bit line contact 146. For example, the bit line contact 146 may be formed at a point where the cell conductive line 140 intersects a central portion of the cell active region ACT having a long island shape. The bit line contact 146 may be formed between the bit line connection region of the cell active region ACT and the cell conductive line 140.

The bit line contact 146 may electrically connect the cell conductive line 140 and the substrate 100. Here, the bit line contact 146 may be or correspond to a direct contact DC. The bit line contact 146 may include, for example, at least one of an impurity-doped semiconductor material such as doped polysilicon, a conductive silicide compound, a conductive metal nitride, and a metal.

In FIG. 5, in a region that overlaps the upper surface of the bit line contact 146, the cell conductive line 140 may include a second cell conductive film 142 and a third cell conductive film 143. In a region that does not overlap the upper surface of the bit line contact 146, the cell conductive line 140 may include first to third cell conductive films 141, 142, and 143.

Although FIG. 5 shows that the bit line contact 146 is not placed between the cell conductive line 140 and the substrate 100 closest to the cell region separation film 22, example embodiments are not limited thereto. Unlike the shown configuration, a bit line contact 146 may be placed between the cell conductive line 140 and the substrate 100 closest to the cell region separation film 22.

The cell line capping film 144 may be placed on the cell conductive line 140. The cell line capping film 144 may extend in the second direction D2 along the upper surface of the cell conductive line 140. At this time, the cell line capping film 144 may include, for example, at least one of silicon nitride film, silicon oxynitride, silicon carbonitride and silicon oxycarbonitride. In the semiconductor memory device according to some example embodiments, the cell line capping film 144 may include, for example, a silicon nitride film. Although the cell line capping film 144 is shown as a single film, example embodiments are not limited thereto. As an example, unlike the shown configuration, the cell line capping film 144 may have a double film structure. As another example, the cell line capping film 144 may have a triple film structure. As still another example, the cell line capping film 144 may have a structure of a fourfold film or more. Furthermore example embodiments are not limited to the above, and none of the above features are necessarily mutually exclusive to one another.

The cell insulating film 130 may be formed on the substrate 100 and the cell element separation film 105. More specifically, the cell insulating film 130 may be formed on the substrate 100 in which the bit line contact 146 and the storage contact 120 are not formed, and on the cell element separation film 105 and the cell region separation film 22. The cell insulating film 130 may be formed between the substrate 100 and the cell conductive line 140, and between the cell element separation film 105 and the cell conductive line 140.

Although the cell insulating film 130 may be or correspond to a single film, the cell insulating film 130 may be or include a multi-film including a first cell insulating film 131 and a second cell insulating film 132 as shown. For example, the first cell insulating film 131 may include a silicon oxide film, and the second cell insulating film 132 may include a silicon nitride film, but are not limited thereto. Unlike the shown configuration, the cell insulating film 130 may be, but is not limited to, a triple film including a silicon oxide film, a silicon nitride film and a silicon oxide film. The cell insulating film 130 may be formed with an oxidation process and/or with a deposition process; however, example embodiments are not limited thereto.

A cell buffer film 101 may be placed between the cell insulating film 130 and the cell region separation film 22. The cell buffer film 101 may include, but is not limited to, for example, a silicon oxide film.

A cell line spacer 150 may be placed on the side walls of the cell conductive line 140 and the cell line capping film 144. In the portion of the cell conductive line 140 in which the bit line contact 146 is formed, the cell line spacer 150 may be formed on the substrate 100 and the cell element separation film 105. The cell line spacer 150 may be placed on the side walls of the cell conductive line 140, the cell line capping film 144, and the bit line contact 146.

However, in the remaining portion of the cell conductive line 140 in which the bit line contact 146 is not formed, the cell line spacer 150 may be placed on the cell insulating film 130. The cell line spacer 150 may be placed on the side walls of the cell conductive line 140 and the cell line capping film 144.

Although the cell line spacer 150 may be or correspond to a single film, the cell line spacer 150 may be or may include a multi-film including the first to fourth cell line spacers 151, 152, 153, and 154 as shown. For example, the first to fourth cell line spacers 151, 152, 153, and 154 may include, but are not limited to, one of silicon oxide film, silicon nitride film, silicon oxynitride film (SiON), silicon oxycarbonitride film (SiOCN), air such as clean, dry air (CDA), and combinations thereof.

For example, the second cell line spacer 152 is not placed on the cell insulating film 130, but may be placed on the side walls of the bit line contact 146. In FIGS. 3 and 5, a bit line structure 140ST may extend long in the second direction D2. The cell line spacer 150 may be placed on the long side wall extending in the second direction D2 among the side walls of the bit line structure 140ST.

In FIG. 5, a dummy bit line structure 140ST_1 may be placed on the cell region separation film 22. The dummy bit line structure 140ST_1 may have the same structure as the bit line structure 140ST, but may not be electrically active during operation of the semiconductor device. For example, the dummy bit line structure 140ST_1 may include a cell conductive line 140, and a cell line capping film 144. Here, the cell conductive line 140 of the dummy bit line structure 140ST_1 may correspond to a boundary bit line BL_IF.

A guard pattern/fence pattern 170 may be placed on the substrate 100 and the cell element separation film 105. The fence pattern 170 may be formed to overlap cell gate structure 110 formed in the substrate 100 and the cell element separation film 105. The fence pattern 170 may be placed between the bit line structures 140ST extending in the second direction D2. The fence pattern 170 may include, for example, at least one of silicon oxide, silicon nitride, silicon oxynitride, and a combination thereof.

The storage contact 120 may be placed between the cell conductive lines 140 adjacent to each other in the first direction D1. The storage contact 120 may be placed between the fence patterns 170 adjacent to each other in the second direction D2. The storage contact 120 may overlap the substrate 100 and the cell element separation film 105 between the adjacent cells conductive line 140. The storage contact 120 may be connected to the storage connection region of the cell active region ACT. Here, the storage contact 120 may correspond to the cell contact/the buried contact BC.

The storage contact 120 may include, for example, at least one of an impurity-doped semiconductor material such as doped polysilicon, a conductive silicide compound, a conductive metal nitride, and a metal.

The storage pad 160 may be formed on the storage contact 120. The storage pad 160 may be electrically connected to the storage contact 120. The storage pad 160 may be connected to the storage connection region of the cell active region ACT. Here, the storage pad 160 may correspond to the landing pad LP.

The storage pad 160 may overlap a part of the upper surface of the bit line structure 140ST. The storage pad 160 may include, for example, at least one of an impurity-doped semiconductor material such as doped polysilicon, a conductive silicide compound, a conductive metal nitride, a conductive metal carbide, a metal, and a metal alloy.

The pad separation insulating film 180 may be formed on the storage pad 160 and the bit line structure 140ST. For example, the pad separation insulating film 180 may be placed on the cell line capping film 144. The pad separation insulating film 180 may define a storage pad 160 that forms a plurality of isolated regions. The pad separation insulating film 180 may not cover the upper surface of the storage pad 160. The pad separation insulating film 180 may fill a pad separation recess 180R. The pad separation recess 180R may separate the adjacent storage pads 160. For example, the height of the upper surface 160US of the storage pad may be the same as the height of the upper surface of the pad separation insulating film 180 on the basis of the upper surface of the substrate 100.

The pad separation insulating film 180 includes an insulating material, and may electrically separate a plurality of storage pads 160 from each other. For example, the pad separation insulating film 180 may include, for example, at least one of a silicon oxide film, a silicon nitride film, a silicon oxynitride film, a silicon oxycarbonitride film, and a silicon carbonitride film.

The peri element separation film 26 may be formed in the substrate 100 of the peri region 24. The peri element separation film 26 may define a peri active region inside the peri region 24. Although the upper surface of the peri element separation film 26 is shown as being placed on the same plane as the upper surface of the substrate 100, example embodiments are not limited thereto. The peri element separation film 26 may include, but is not limited to, for example, at least one of a silicon oxide film, a silicon nitride film, and a silicon oxynitride film. The peri element separation film 26 may include the same, or different, material from that of the cell element separation film 105 and/or the cell region separation film 22, and may be formed at the same time, or at a different time, from either or both of the cell element separation film 105 and/or the cell region separation film 22.

The peri gate structure 240ST may be placed on the substrate 100 of the peri region 24. The peri gate structure 240ST may be placed on the peri active region defined by the peri element separation film 26.

The peri gate structure 240ST may include a peri gate insulating film 230, a peri gate conductive film 240, and a peri capping film 244 that are sequentially stacked on the substrate 100. The peri gate structure 240ST may include a peri spacer 245 placed on the side walls of the peri gate conductive film 240 and the side walls of the peri capping film 244.

The peri gate conductive film 240 may include first to third peri conductive films 241, 242, and 243 sequentially stacked on the peri gate insulating film 230. As an example, an additional conductive film may not be placed between the peri gate conductive film 240 and the peri gate insulating film 230. As another example, unlike the shown configuration, an additional conductive film, such as a work function conductive film, may be placed between the peri gate conductive film 240 and the peri gate insulating film 230.

Although two peri gate structures 240ST are shown as being placed between the adjacent peri element separation films 26, this is only for convenience of explanation, and example embodiments are not limited thereto. The peri gate structures 240ST may correspond to gates of peripheral transistors, such as transistors used in row decoding, or in column decoding, and/or in buffering, and/or in other logic functions performed in the semiconductor device. The peri gate structures 240ST may correspond to planar complementary metal-oxide semiconductor (CMOS) transistors, and may correspond to N-type transistor gates or P-type transistor gates; however, example embodiments are not limited thereto.

A block conductive structure 240ST_1 may be placed between the cell region 20 and the peri region 24. Although a part of the block conductive structure 240ST_1 is shown to overlap the cell region separation film 22, example embodiments are not limited thereto. The block conductive structure 240ST_1 may be a conductive structure that is closest to the dummy bit line structure 140ST_1 in the first direction D1.

The block conductive structure 240ST_1 may include a block gate insulating film 230_1, a block conductive line 240_1, and a block capping film 244_1 that are sequentially stacked on the substrate 100. The block conductive structure 240ST_1 may include a block spacer 245_1 placed on the side walls of the block conductive line 240_1 and on the side walls of the block capping film 244_1. Here, the block conductive line 240_1 may correspond to the boundary peri gate PR_ST1.

The block conductive line 240_1 may include first_1 to first_3 block conductive films 241_1, 242_1, and 243_1 that are sequentially stacked on the block gate insulating film 230_1. A stacked film structure of the block conductive line 240_1 between the block gate insulating film 230_1 and the block capping film 244_1 may be the same as a stacked film structure of the peri gate conductive film 240; however, example embodiments are not limited thereto.

The peri gate structure 240ST and the block conductive structure 240ST_1 may be formed at the same level. Here, the term "same level" corresponds to both being formed by the same fabricating process. The peri gate conductive film 240 and the block conductive line 240_1 may have the same stacked structure as that of the cell conductive line 140.

The first peri conductive film 241 and the first_1 block conductive film 241_1 may include the same material as that of the first cell conductive film 141. The second peri conductive film 242 and the first_2 block conductive film 242_1 may include the same material as that of the second cell conductive film 142. The third peri conductive film 243 and the first_3 block conductive film 243_1 may include the same material as that of the third cell conductive film 143. Any of the first peri conductive film 241 and the first_1 block conductive film 241_1, the second peri conductive film 242 and the first_2 block conductive film 242_1, and the third peri conductive film 243 and the first_3 block conductive film 243_1 may include the same material as each other.

The peri gate insulating film 230 and the block gate insulating film 230_1 may include the same material, and may be formed at the same time; however, example embodiments are not limited thereto. The peri gate insulating film 230 and the block gate insulating film 230_1 may include, for example, silicon oxide, silicon nitride, silicon oxynitride, or a high dielectric constant material having a higher dielectric constant than silicon oxide.

The peri spacer 245 and the block spacer 245_1 may include the same material, and may be formed at the same time; however, example embodiments are not limited thereto. The peri spacer 245 and the block spacer 245_1 may include, for example, at least one of silicon nitride, silicon oxynitride, silicon oxide, silicon carbonitride, silicon oxycarbonitride and combinations thereof. Although the peri spacer 245 and the block spacer 245_1 are shown as a single film, this is only for convenience of explanation, and example embodiments are not limited thereto. The peri spacer 245 and the block spacer 245_1 may be multi-films.

The peri capping film 244 and the block capping film 244_1 may include the same material, and may be formed at the same time; however, example embodiments are not limited thereto. The peri capping film 244 and the block capping film 244_1 may include, for example, at least one of silicon nitride film, silicon oxynitride and silicon oxide.

A lower etching stop film 250 may be placed on the substrate 100. The lower etching stop film 250 may be formed along the profile of the peri gate structure 240ST and the profile of the block conductive structure 240ST_1. The lower etching stop film 250 may extend along the side walls of the dummy bit line structure 140ST_1. The lower etching stop film 250 may include, for example, at least one of silicon nitride film, silicon oxynitride, silicon carbonitride and silicon oxycarbonitride.

The lower peri interlayer insulating film 290 may be placed on the lower etching stop film 250. The lower peri interlayer insulating film 290 may be placed around the peri gate structure 240ST. The lower peri interlayer insulating film 290 may be placed on the cell region separation film 22 between the dummy bit line structure 140ST_1 and the block conductive structure 240ST_1.

The lower peri interlayer insulating film 290 may include an oxide-based insulating material. The upper surface of the lower peri interlayer insulating film 290 may be placed on the same plane as the lower etching stop film 250 extending along the upper surface of the peri gate structure 240ST.

The upper peri interlayer insulating film 291 may be placed on the peri gate structure 240ST and the lower peri interlayer insulating film 290. The upper peri interlayer insulating film 291 may cover the peri gate structure 240ST and the lower peri interlayer insulating film 290. For example, the height of the upper surface of the upper peri interlayer insulating film 291 may be the same as the height of the upper surface of the cell line capping film 144 on the basis of the upper surface of the substrate 100.

The upper peri interlayer insulating film 291 includes a material different from that of the lower peri interlayer insulating film 290. The upper peri interlayer insulating film 291 may include, for example, a nitride-based insulating material and may not include an oxide-based insulating material. For example, the upper peri interlayer insulating film 291 may include silicon nitride.

A peri contact plug 260 may be placed on both sides of the peri gate structure 240ST. The peri contact plug 260 may penetrate the upper peri interlayer insulating film 291 and the lower peri interlayer insulating film 290 and extend to the substrate 100 of the peri region 24. The peri contact plug 260 is connected to the substrate 100 of the peri region 24. The peri wiring line 265 may be placed on the upper peri interlayer insulating film 291. The peri contact plug 260 and the peri wiring line 265 may be separated by a wiring separation recess 280R. A width of the wiring separation recess 280R may be various.

The peri contact plug 260 and the peri wiring line 265 may include the same material as that of the storage pad 160, and may be formed at the same time as each other. The peri contact plug 260 and the peri wiring line 265 may be formed at the same level as the storage pad 160.

An upper surface 260US of the peri contact plug may be placed on the same plane as the upper surface 265US of the peri wiring line. The upper surface 265US of the peri wiring line may be placed on the same plane as the upper surface 160US of the storage pad.

The first interlayer insulating film 295 may be placed over the cell region 20 and the peri region 24. The first interlayer insulating film 295 may be placed on the storage pad 160, the peri contact plug 260 and the peri wiring line 265. The first interlayer insulating film 295 may be placed on the upper peri interlayer insulating film 291.

For example, referring to FIG. 5 a first thickness t1 of the first interlayer insulating film 295 on the upper surface 160US of the storage pad is smaller than/thinner than a second thickness t2 of the first interlayer insulating film 295 on the upper surface 260US of the peri contact plug. The thickness of the first interlayer insulating film 295 on the upper surface 260US of the peri contact plug may be the same as the thickness of the first interlayer insulating film 295 on the upper surface 265US of the peri wiring line.

The first interlayer insulating film 295 may include a first lower interlayer insulating film 296 and a first upper interlayer insulating film 297. For example, the first upper interlayer insulating film 297 may be an upper etching stop film.

In the semiconductor memory device according to some example embodiments, the first lower interlayer insulating film 296 may be placed on the upper surface 260US of the peri contact plug and the upper surface 265US of the peri wiring line. The first lower interlayer insulating film 296 is not placed on the upper surface 160US of the storage pad.

The first upper interlayer insulating film 297 may be placed on the upper surface 260US of the peri contact plug, the upper surface 265US of the peri wiring line, and the upper surface 160US of the storage pad. The first lower interlayer insulating film 296 covers the upper surface 260US of the peri contact plug and the upper surface 265US of the peri wiring line.

In the semiconductor memory device according to some example embodiments, a difference between the first thickness t1 of the first interlayer insulating film 295 and the second thickness t2 of the first interlayer insulating film 295 may be caused by/associated with the thickness of the first lower interlayer insulating film 296.

The first lower interlayer insulating film 296 may fill the wiring separation recess 280R. In FIG. 4A, the first lower interlayer insulating film 296 may entirely fill the wiring separation recess 280R. In FIG. 4B, an air gap AG surrounded by the first lower interlayer insulating film 296 may be placed inside the wiring separation recess 280R.

The upper surface 295US of the first interlayer insulating film may include a step structure 295US_ST. The first lower interlayer insulating film 296 includes a terminal 296EP. The step structure 295US_ST of the first interlayer insulating film 295 may be formed at the terminal 296EP of the first lower interlayer insulating film.

In the semiconductor memory device according to some example embodiments, the first lower interlayer insulating film 296 does not extend to the cell region 20. Alternatively, the termination 296EP of the first lower interlayer insulating film may be located on the cell region separation film 22. The first lower interlayer insulating film 296 includes the termination 296EP of the first lower interlayer insulating film placed on the cell region separation film 22. The termination 296EP of the first lower interlayer insulating film may be placed at a position which overlaps vertically (in a fourth direction D4) the upper surface of the cell region separation film 22. Hereinafter, the term "vertical direction" or "vertical" will be described as being the fourth direction D4, which is perpendicular to a surface of the substrate 100.

The step structure 295US_ST of the first interlayer insulating film 295 may be formed on/defined by the cell region separation film 22.

As an example, each of the first lower interlayer insulating film 296 and the first upper interlayer insulating film 297 may each include a nitride-based insulating material. The first lower interlayer insulating film 296 and the first upper interlayer insulating film 297 may include, for example, at least one of silicon nitride, silicon carbonitride, silicon oxycarbonitride and silicon boronitride (SiBN), respectively.

As another example, the first lower interlayer insulating film 296 may include a nitride-based insulating material.

The first upper interlayer insulating film 297 may include, for example, a silicon oxycarbide (SiOC).

By setting the second thickness t2 of the first interlayer insulating film 295 on the upper surface 260US of the peri contact plug to be greater than the first thickness t1 of the first interlayer insulating film 295 on the upper surface 160US of the storage pad, in the etching process included in the process of fabricating the information storage unit 190, the first interlayer insulating film 295 may protect or help to protect the lower peri interlayer insulating film 290, e.g. protect or help to protect incidental etching of the lower peri interlayer insulating film 290. In the etching process included in the process of fabricating the information storage unit 190, the first interlayer insulating film 295 may prevent, or reduce the likelihood of and/or impact from, defects caused by etching the lower peri interlayer insulating film 290.

The information storage circuit/unit 190 may be placed on the storage pad 160. The information storage unit 190 may be electrically connected to the storage pad 160. A part of the information storage unit 190 may be placed in the first upper interlayer insulating film 297. The information storage unit 190 may include, but is not limited to, for example, a capacitor. The information storage unit 190 includes a first lower electrode 191, a first capacitor dielectric film 192, and a first upper electrode 193. For example, the first upper electrode 193 may be a plate upper electrode having a plate form.

Alternatively or additionally, the information storage unit 190 may include a memristor, and/or may include a hysteresis device and/or other non-linear circuit. Alternatively or additionally the information storage unit 190 may be a two-terminal circuit, or a three-terminal circuit, or a device having more than three circuit. The information storage unit 190 maybe capable of storing information based on an electrical and/or magnetic and/or physical property of the information storage unit 190.

The first lower electrode 191 may be placed on the storage pad 160. The first lower electrode 191 is shown to have a pillar shape, but example embodiments are not limited thereto. The first lower electrode 191 may have a cylinder shape. The first capacitor dielectric film 192 is formed on the first lower electrode 191. The first capacitor dielectric film 192 may be formed along the profile of the first lower electrode 191. The first upper electrode 193 may be formed on the first capacitor dielectric film 192. The first upper electrode 193 may wrap the outer wall of the first lower electrode 191.

In the semiconductor memory device according to some example embodiments, the first capacitor dielectric film 192 may include a first portion that vertically overlaps the first upper electrode 193, and a second portion that does not vertically overlap the first upper electrode 193. The second portion of the first capacitor dielectric film 192 is a portion that is not covered with the first upper electrode 193.

In the semiconductor memory device according to some example embodiments, the first upper electrode 193 may cover a part of the first lower interlayer insulating film 296. The first upper electrode 193 may vertically overlap the first lower interlayer insulating film 296. The first lower interlayer insulating film 296 may include a first portion that vertically overlaps the first upper electrode 193, and a second portion that does not vertically overlap the first upper electrode 193.

The first upper electrode 193 may cover the terminal 296EP of the first lower interlayer insulating film. The step structure 295US_ST of the first interlayer insulating film 295 may be formed at a position which vertically overlaps the first upper electrode 193. The first upper interlayer insulating film 297 extends between the first lower interlayer insulating film 296 and the first upper electrode 193.

The first lower electrode 191 and the first upper electrode 193 may include, but are not limited to, for example, a doped semiconductor material such as doped polysilicon, a conductive metal nitride (e.g., titanium nitride, tantalum nitride, niobium nitride or tungsten nitride), metals (e.g., one or more of ruthenium, iridium, titanium or tantalum, etc.), and conductive metal oxides (e.g., one or more of iridium oxide or niobium oxide, etc.). The first upper electrode 193 is shown as a single film, but is not limited thereto. The first upper electrode 193 may include a plurality of conductive films, and each conductive film may include different conductive materials from each other.

The first capacitor dielectric film 192 may include, but is not limited to, for example, one of silicon oxide, silicon nitride, silicon oxynitride, high dielectric constant materials, and combinations thereof. In the semiconductor memory device according to some example embodiments, the first capacitor dielectric film 192 may have a stacked film structure in which zirconium oxide, aluminum oxide, and zirconium oxide are sequentially stacked. In the semiconductor memory device according to some example embodiments, the first capacitor dielectric film 192 may include a dielectric film containing hafnium (Hf). In the semiconductor memory device according to some example embodiments, the first capacitor dielectric film 192 may have a stacked film structure of a ferroelectric material film and a paraelectric material film.

Although the height of the first lower electrode 191 is shown as being similar to the height from the upper surface of the substrate 100 to the upper surface 160US of the storage pad, this is only for convenience of explanation, and example embodiments are not limited thereto. The edge portion of the first upper electrode 193 is shown as having an L-shape, but example embodiments are not limited thereto.

The second interlayer insulating film 292 may be placed on the first interlayer insulating film 295. The second interlayer insulating film 292 covers the side wall 193SW of the first upper electrode.

The first capacitor dielectric film 192 may extend along the boundary between the first interlayer insulating film 295 and the second interlayer insulating film 292. The first upper interlayer insulating film 297 extends between the first lower interlayer insulating film 296 and the second interlayer insulating film 292.

The second interlayer insulating film 292 may include, but is not limited to, for example, an oxide-based insulating material. The second interlayer insulating film 292 may include a material having an etching selectivity with, e.g. being slower to etch than, the first upper interlayer insulating film 297.

Figure 7:
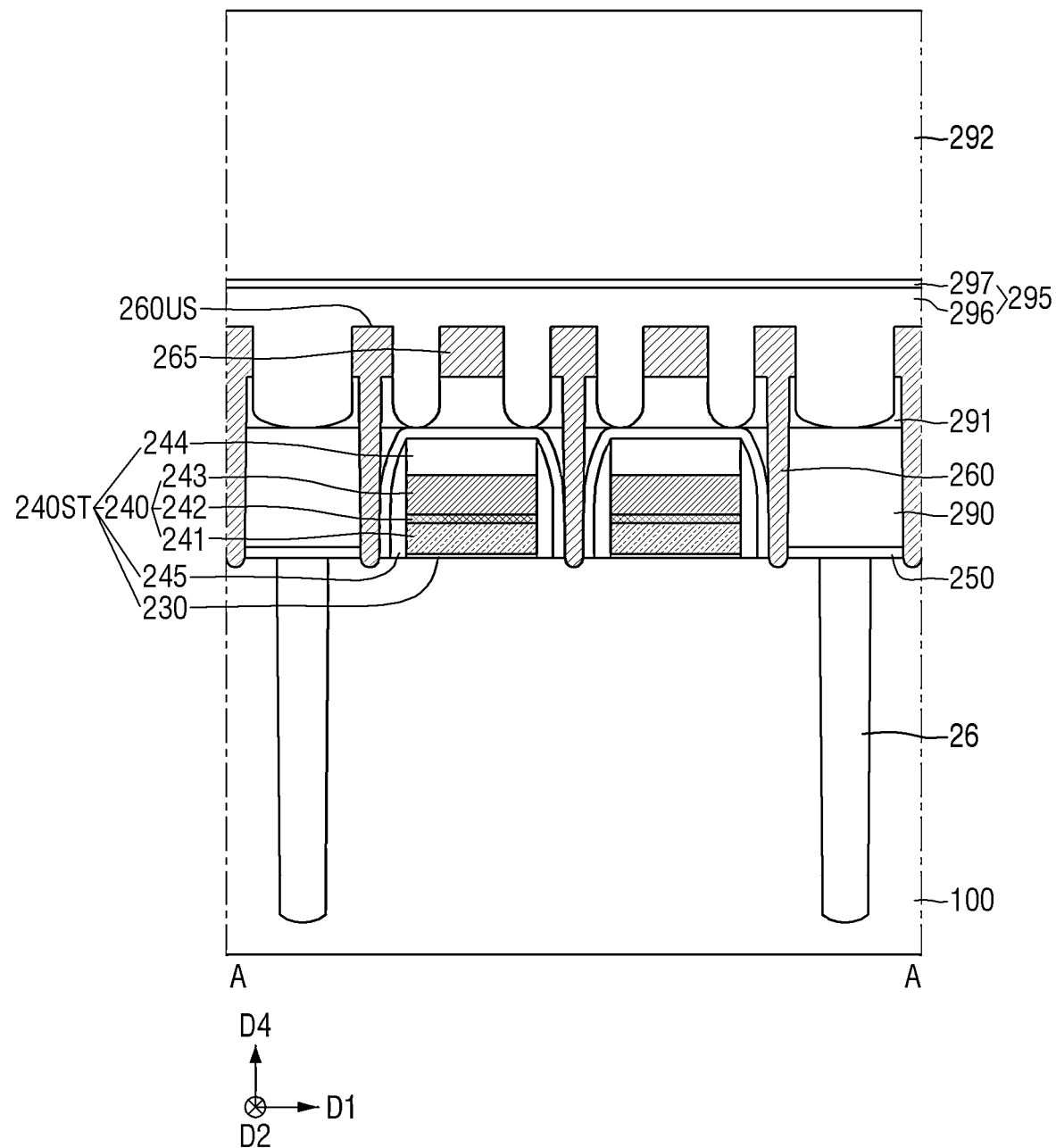
FIGS. 7 and 8 are diagrams for explaining a semiconductor memory device according to some example embodiments.
Figure 8:
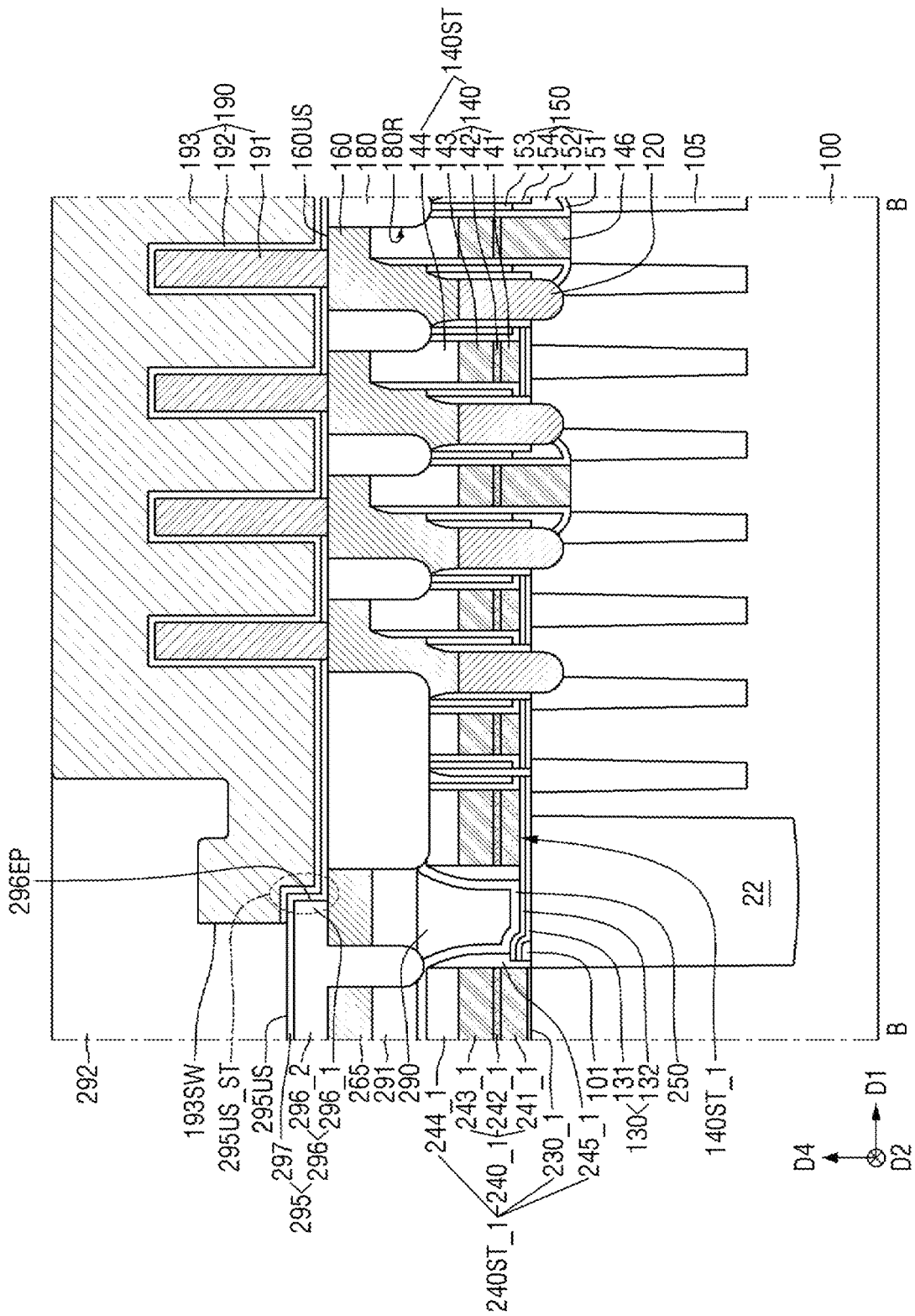

FIGS. 7 and 8 are diagrams for explaining the semiconductor memory device according to some example embodiments. For convenience of explanation, different points from those described using FIGS. 1 to 6 will be mainly described.

Referring to FIGS. 7 and 8, in the semiconductor memory device according to some example embodiments, the first capacitor dielectric film 192 is placed at a portion which vertically overlaps the first upper electrode 193. The first capacitor dielectric film 192 is not placed in a portion that does not vertically overlap the first upper electrode 193.

The first capacitor dielectric film 192 does not include a portion that protrudes beyond the side wall 193SW of the first upper electrode in the first direction D1. The first capacitor dielectric film 192 does not extend along the boundary between the first interlayer insulating film 295 and the second interlayer insulating film 292. The first capacitor dielectric film 192 is not placed between the first interlayer insulating film 295 and the second interlayer insulating film 292.

The first capacitor dielectric film 192 is not formed on the upper surface 295US of the first interlayer insulating film which is not covered with the first upper electrode 193. The first interlayer insulating film 295 may be in contact with, e.g. in direct contact with the second interlayer insulating film 292.

The first lower interlayer insulating film 296 may include a first portion 296_1 that vertically overlaps the first upper electrode 193, and a second portion 296_2 that does not vertically overlap the first upper electrode 193. The first capacitor dielectric film 192 overlaps the first portion 296_1 of the first lower interlayer insulating film in the fourth direction D4. The first capacitor dielectric film 192 does not overlap the second portion 296_2 of the first lower interlayer insulating film in the fourth direction D4.

The first capacitor dielectric film 192 does not extend along the upper surface 295US of the first interlayer insulating film that covers the peri gate structure 240ST.

Figure 9:
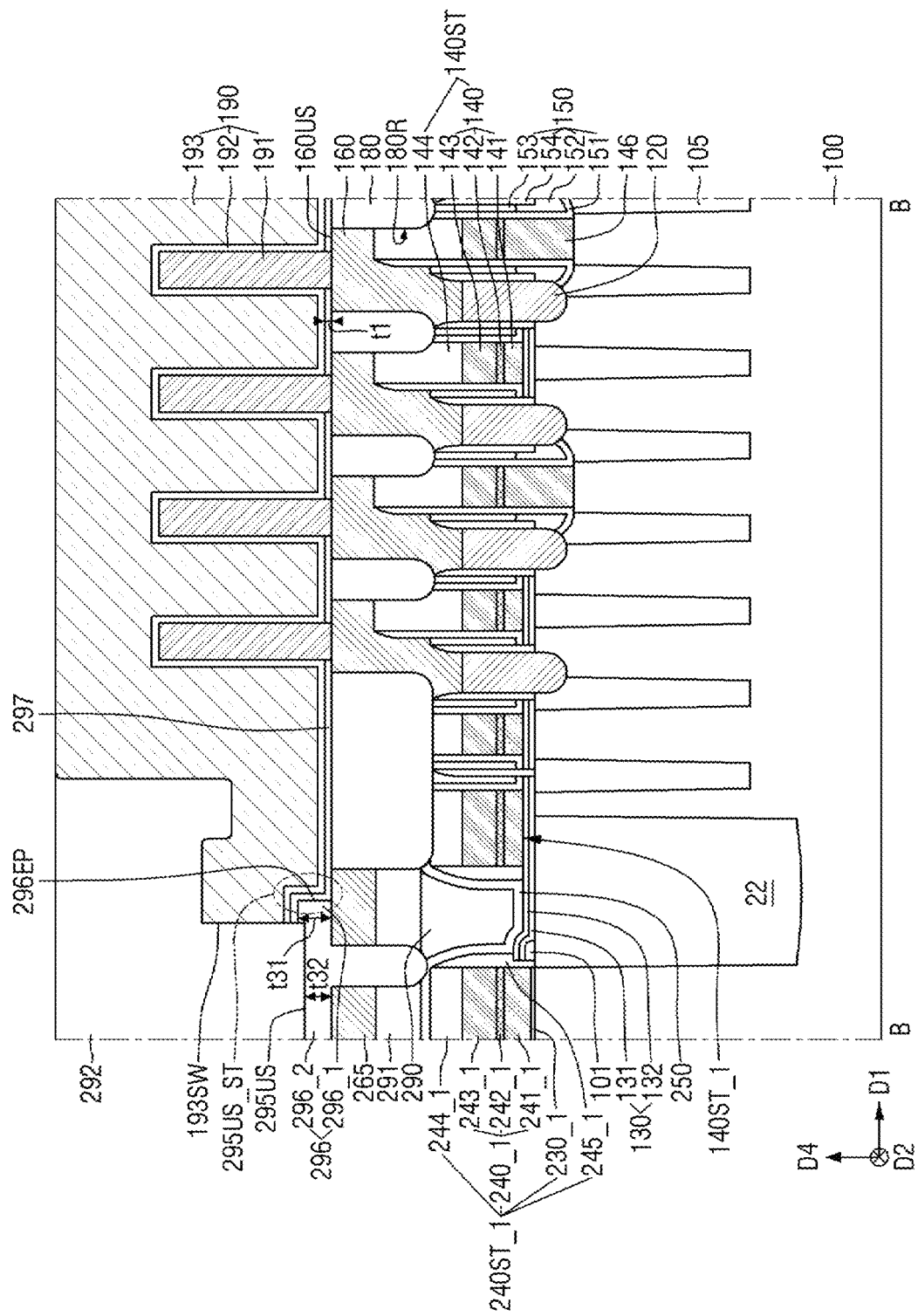
FIG. 9 is a diagram for explaining the semiconductor memory device according to some example embodiments.

FIG. 9 is a diagram for explaining a semiconductor memory device according to some example embodiments. For convenience of explanation, different points from those described using FIGS. 7 and 8 will be mainly described.

Referring to FIG. 9, in the semiconductor memory device according to some example embodiments, a thickness t31 of the first portion 296_1 of the first lower interlayer insulating film may be greater than or equal to a thickness t32 of the second portion 296_2 of the first lower interlayer insulating film.

Near the side wall 193SW of the first upper electrode, the upper surface 295US of the first interlayer insulating film may have another staircase structure.

According to some example embodiments, a part of the first lower interlayer insulating film 296 that does not vertically overlap the first upper electrode 193, and the first upper interlayer insulating film 297 may be etched. In such a case, a thickness t31 of the first portion 296_1 of the first lower interlayer insulating film may be greater than a thickness t32 of the second portion 296_2 of the first lower interlayer insulating film.

In such a case, the first interlayer insulating film (295 of FIG. 4A) on the upper surface 260US of the peri contact plug includes the second portion 296_2 of the first lower interlayer insulating film. The second thickness t2 of the first interlayer insulating film on the upper surface 260US of the peri contact plug may be the same as the thickness t32 of the second portion 296_2 of the first lower interlayer insulating film. Further, in the portion that vertically overlaps the first upper electrode 193, the thickness of the first lower interlayer insulating film 296 and the first upper interlayer insulating film 297 may be the sum of the thickness t31 of the first portion 296_1 of the first lower interlayer insulating film and the thickness t1 of the first upper interlayer insulating film 297.

In some example embodiments, unlike the shown configuration, the first upper interlayer insulating film 297, which does not vertically overlap the first upper electrode 193, may be etched. However, the first lower interlayer insulating film 296, which does not vertically overlap the first upper electrode 193, may not be etched. In such a case, the thickness t31 of the first portion 296_1 of the first lower interlayer insulating film may be the same as the thickness t32 of the second portion 296_2 of the first lower interlayer insulating film.

In such a case, the first interlayer insulating film (295 of FIG. 4A) on the upper surface 260US of the peri contact plug includes the first lower interlayer insulating film 296. The second thickness t2 of the first interlayer insulating film on the upper surface 260US of the peri contact plug may be the same as the thickness t32 of the second portion 296_2 of the first lower interlayer insulating film.

In some example embodiments, unlike the shown configuration, a part of the first upper interlayer insulating film 297 that does not vertically overlap the first upper electrode 193 may be etched. In such a case, the thickness t31 of the first portion 296_1 of the first lower interlayer insulating film may be the same as the thickness t32 of the second portion 296_2 of the first lower interlayer insulating film.

In such a case, the first interlayer insulating film (295 of FIG. 4A) on the upper surface 260US of the peri contact plug includes a part of the first lower interlayer insulating film 296 and the first upper interlayer insulating film 297. The second thickness t2 of the first interlayer insulating film on the upper surface 260US of the peri contact plug may be the sum of the thickness t32 of the second portion 296_2 of the first lower interlayer insulating film and the thickness of the remaining first upper interlayer insulating film 297.

Figure 10:
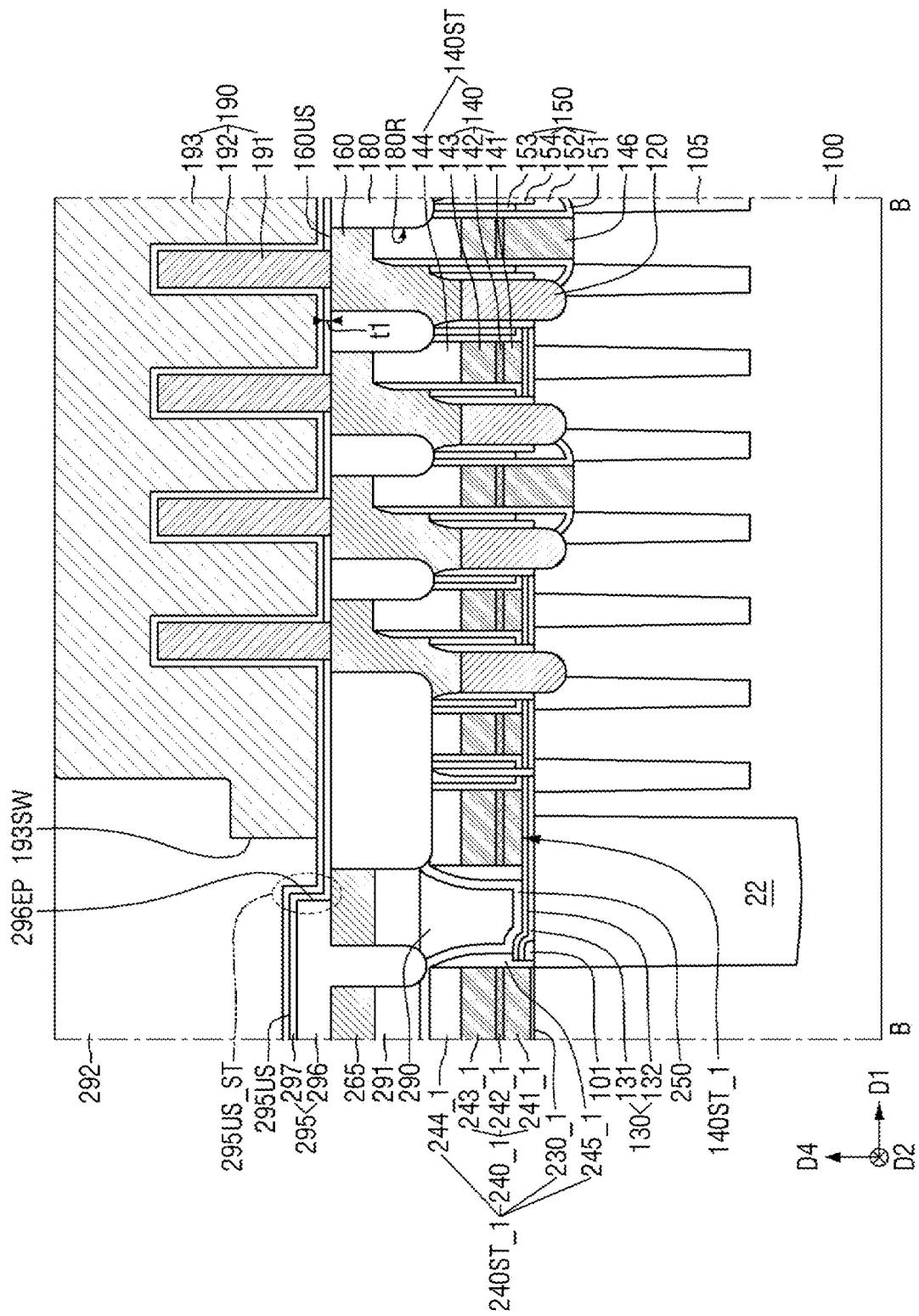
FIG. 10 is a diagram for explaining the semiconductor memory device according to some example embodiments.

FIG. 10 is a diagram for explaining a semiconductor memory device according to some example embodiments. For convenience of explanation, different points from those described using FIGS. 1-3, 4A, 4B, 5 and 6 will be mainly described.

Referring to FIG. 10, in the semiconductor memory device according to some example embodiments, the first upper electrode 193 does not vertically overlap the first lower interlayer insulating film 296.

The first lower interlayer insulating film 296 does not include a portion that vertically overlaps the first upper electrode 193.

The first upper electrode 193 does not cover the terminal 296EP of the first lower interlayer insulating film. The step structure 295US_ST of the first interlayer insulating film 295 may be formed at a position that does not vertically overlap the first upper electrode 193.

Unlike the shown configuration, the first upper electrode 193 may cover a part of the first interlayer insulating film 295, but may not cover the first lower interlayer insulating film 296. In such a case, the first upper electrode 193 does not cover the terminal 296EP of the first lower interlayer insulating film. Alternatively, the step structure 295US_ST of the first interlayer insulating film 295 may be formed at a position that vertically overlaps the first upper electrode 193.

Figure 11:
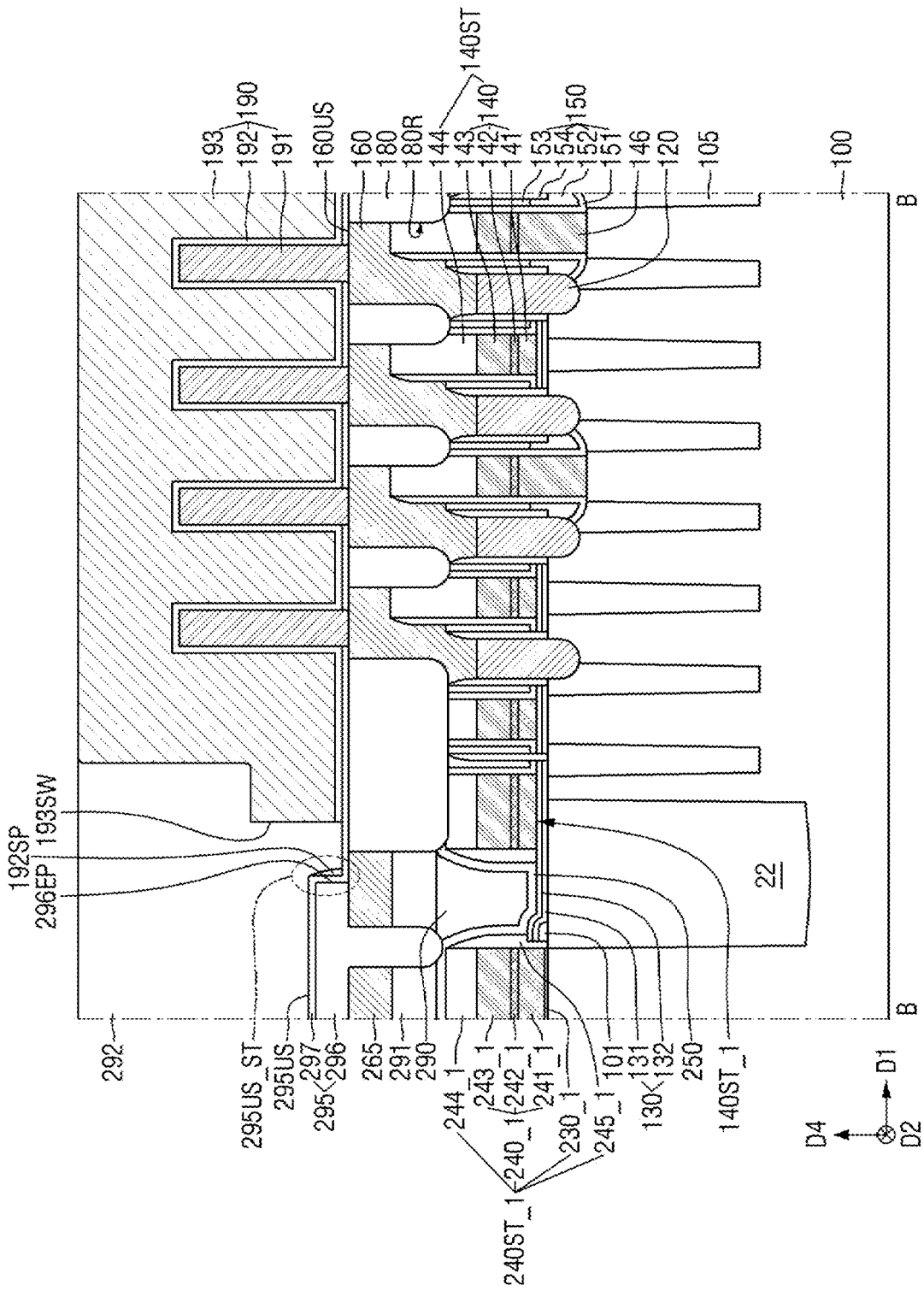
FIG. 11 is a diagram for explaining the semiconductor memory device according to some example embodiments.

FIG. 11 is a diagram for explaining the semiconductor memory device according to some example embodiments. For convenience of explanation, different points from those described using FIG. 10 will be mainly described.

Referring to FIG. 11, a semiconductor memory device according to some example embodiments may further include a dielectric film spacer 192SP formed in the step structure 295US_ST of the first interlayer insulating film 295.

The dielectric film spacer 192SP includes the same material as the first capacitor dielectric film 192. The dielectric film spacer 192SP may be formed while the first capacitor dielectric film 192 placed in a portion that does not vertically overlap the first upper electrode 193 is being removed.

Figure 12:
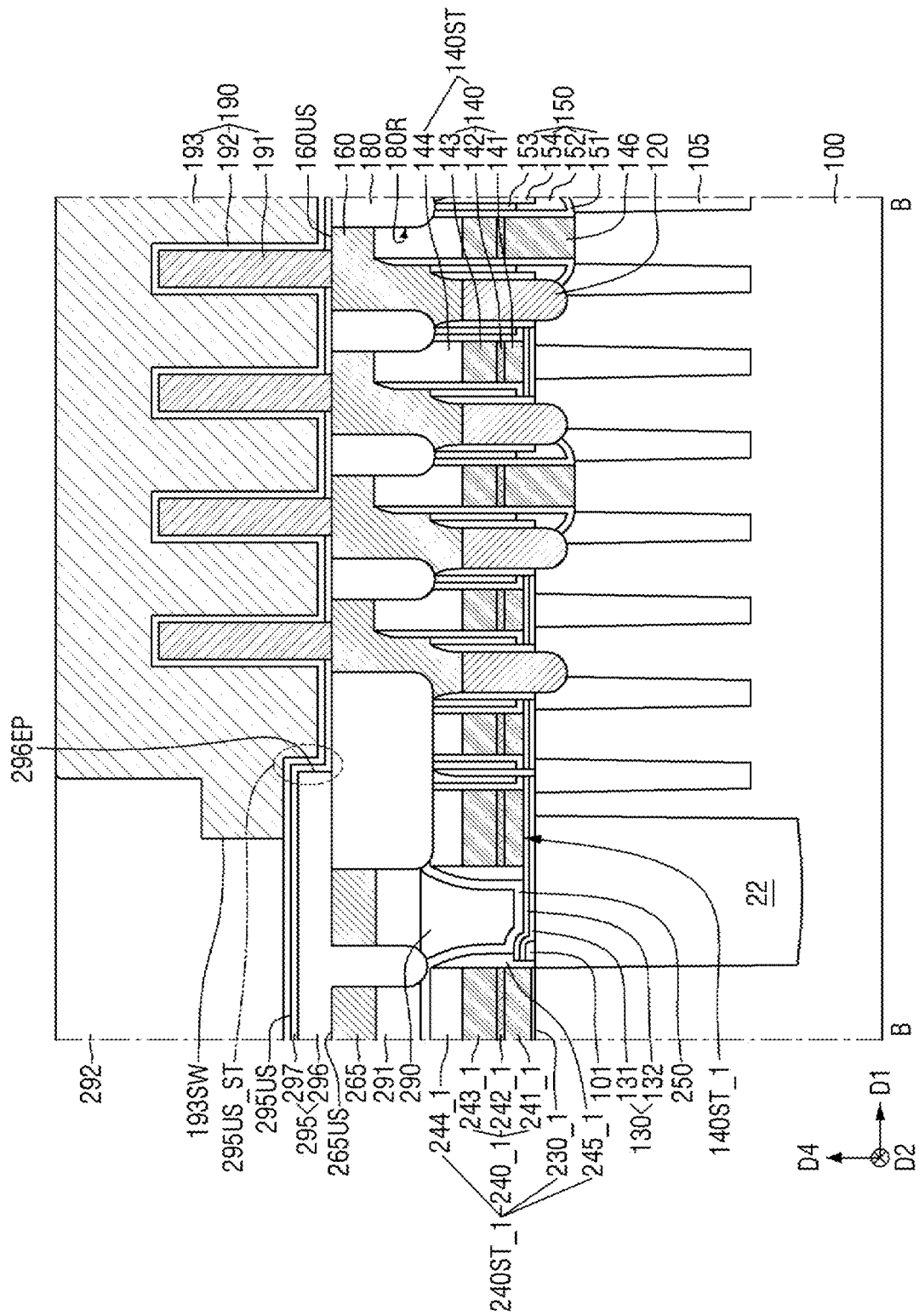
FIG. 12 is a diagram for explaining the semiconductor memory device according to some example embodiments.
Figure 13:
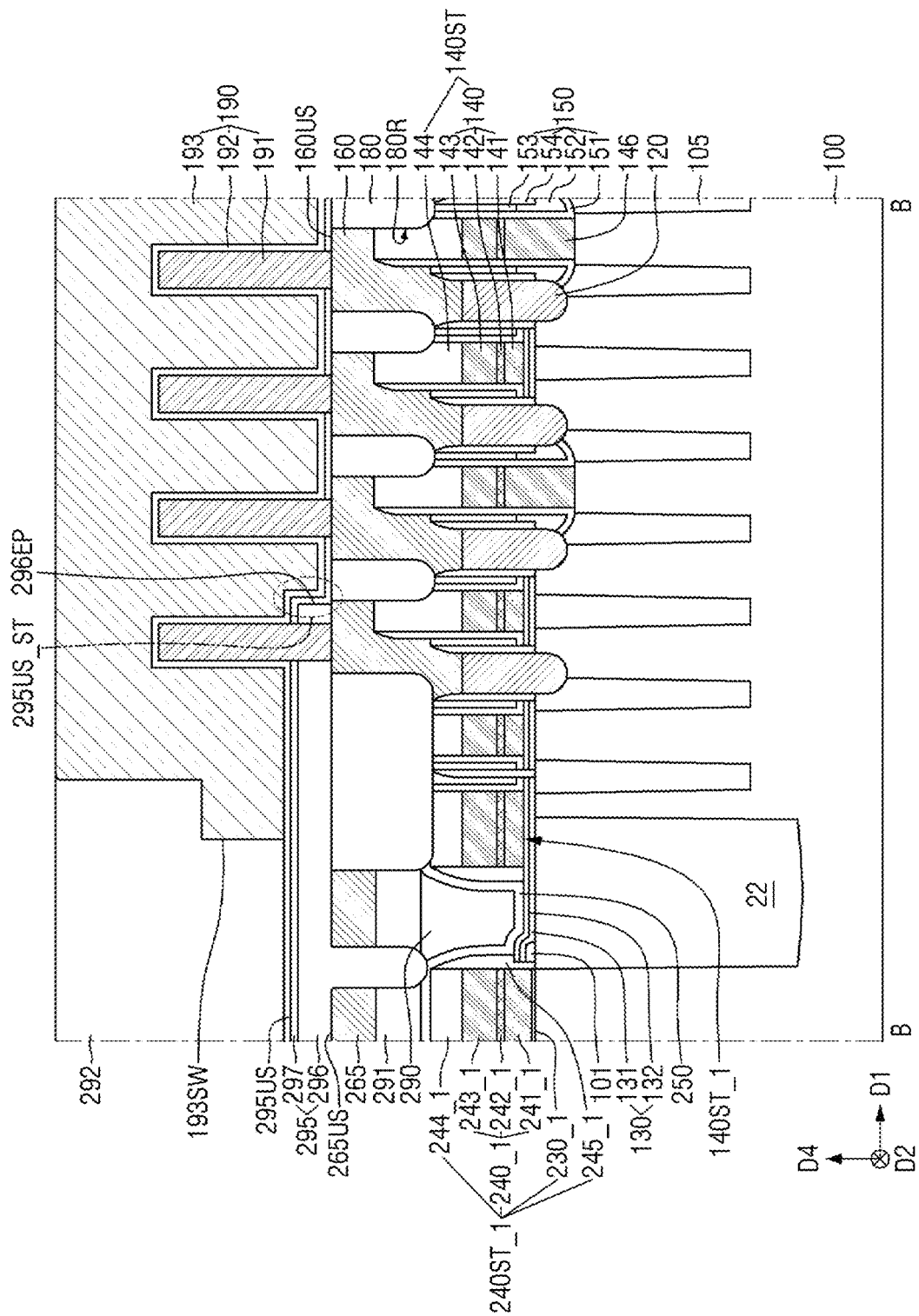
FIG. 13 is a diagram for explaining the semiconductor memory device according to some example embodiments.
Figure 14:
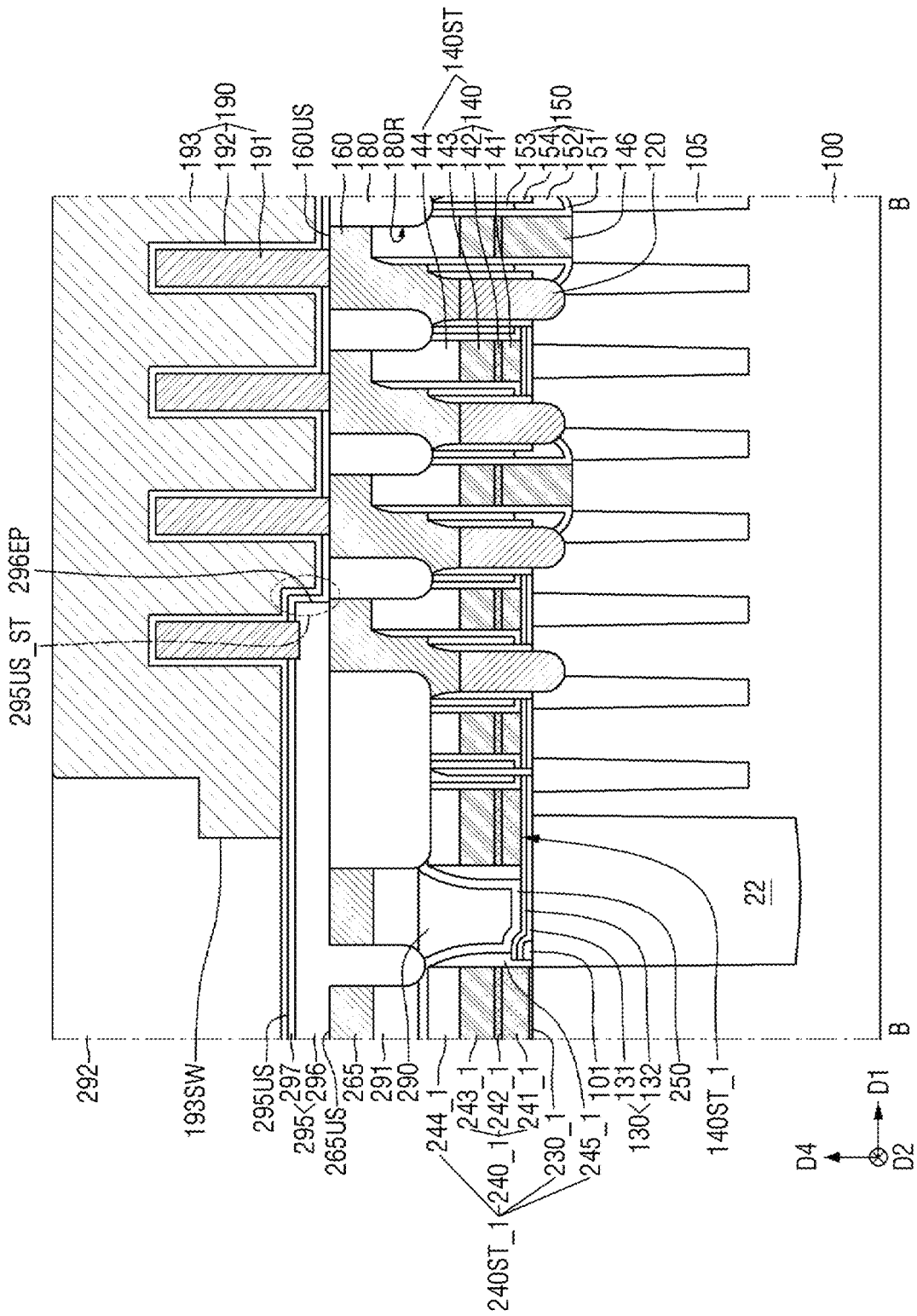
FIG. 14 is a diagram for explaining the semiconductor memory device according to some example embodiments.
Figure 15:
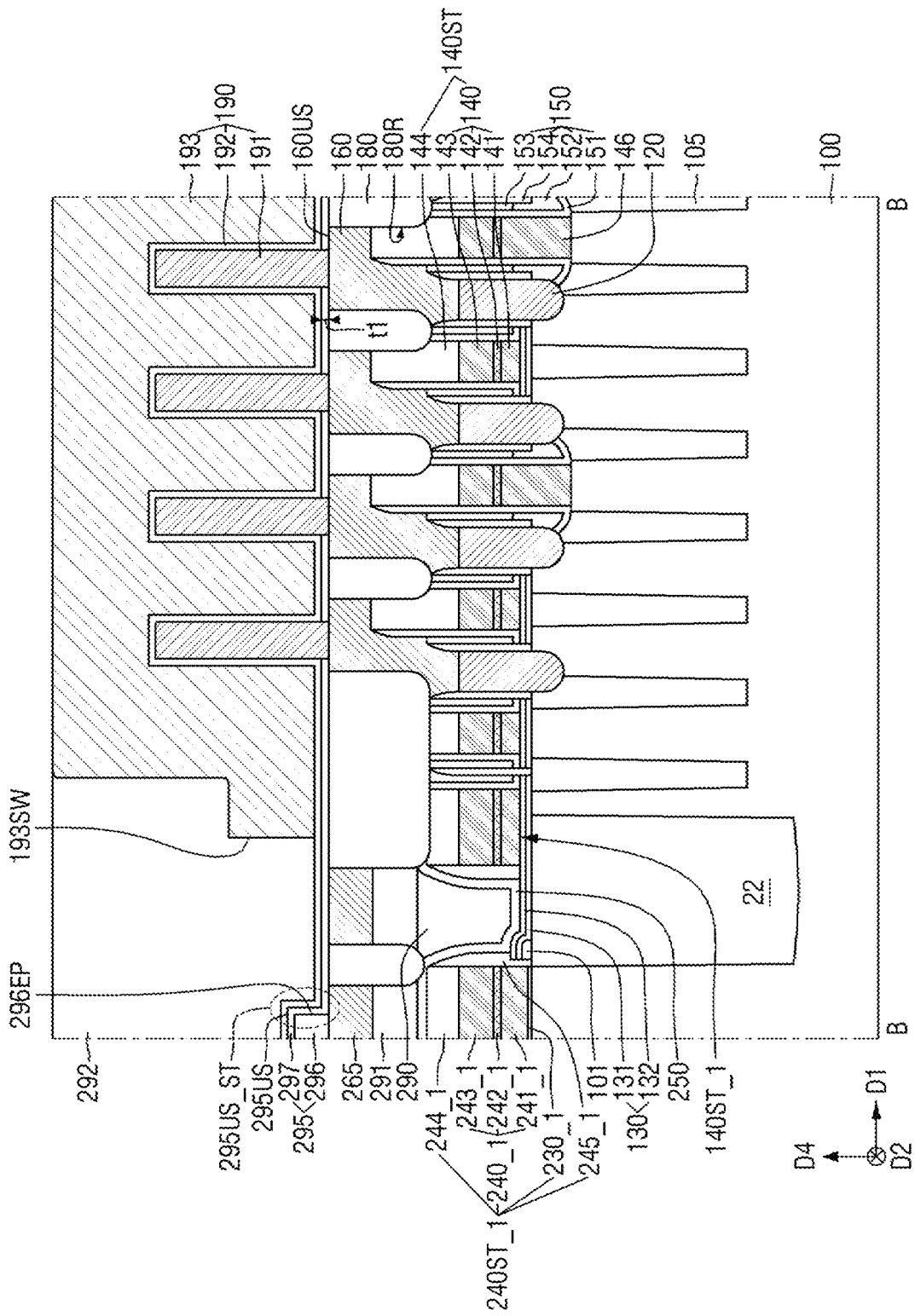
FIG. 15 is a diagram for explaining the semiconductor memory device according to some example embodiments.

FIG. 12 is a diagram for explaining the semiconductor memory device according to some example embodiments. FIG. 13 is a diagram for explaining the semiconductor memory device according to some example embodiments. FIG. 14 is a diagram for explaining the semiconductor memory device according to some example embodiments. FIG. 15 is a diagram for explaining the semiconductor memory device according to some example embodiments. For convenience of explanation, different points from those described using FIGS. 1-3, 4A, 4B, 5 and 6 will be mainly described.

Referring to FIGS. 12 to 14, in the semiconductor memory device according to some example embodiments, the first lower interlayer insulating film 296 may be formed to extend to the cell region 20.

A part of the first lower interlayer insulating film 296 may be formed at a position that overlaps the cell region 20. A part of the first lower interlayer insulating film 296 may be placed on the cell region 20.

In FIG. 12, the first lower interlayer insulating film 296 does not extend to the storage pad 160 that is closest to the cell region separation film 22. The first lower interlayer insulating film 296 does not cover the upper surface 160US of the storage pad that is closest to the cell region separation film 22.

In FIGS. 13 and 14, the first lower interlayer insulating film 296 may extend to the storage pad 160 adjacent to the cell region separation film 22. The first lower interlayer insulating film 296 may cover at least a part of the upper surface 160US of the storage pad that is adjacent to the cell region separation film 22.

In FIG. 13, the first lower electrode 191 may pass through the first lower interlayer insulating film 296 and the first upper interlayer insulating film 297, and be connected to the storage pad 160. In FIG. 14, the first lower electrode 191 does not pass through the first lower interlayer insulating film 296 and the first upper interlayer insulating film 297. The first lower electrode 191 is not connected to the storage pad 160 that is closest to the cell region separation film 22.

In FIGS. 13 and 14, although the first lower interlayer insulating film 296 is shown to extend to the first storage pad 160 adjacent to the cell region separation film 22, this is only for convenience of explanation, and example embodiments are not limited thereto.

Referring to FIG. 15, in the semiconductor memory device according to some example embodiments, the first lower interlayer insulating film 296 does not extend to the cell region separation film 22.

The first lower interlayer insulating film 296 does not include a portion that vertically overlaps the cell region separation film 22. The terminal 296EP of the first lower interlayer insulating film may be located on the peri region 24.

The first upper electrode 193 does not vertically overlap the first lower interlayer insulating film 296.

Unlike the shown configuration, the first upper electrode 193 may vertically overlap the first lower interlayer insulating film 296. The first lower interlayer insulating film 296 may include a portion that vertically overlaps the first upper electrode 193.

Figure 16:
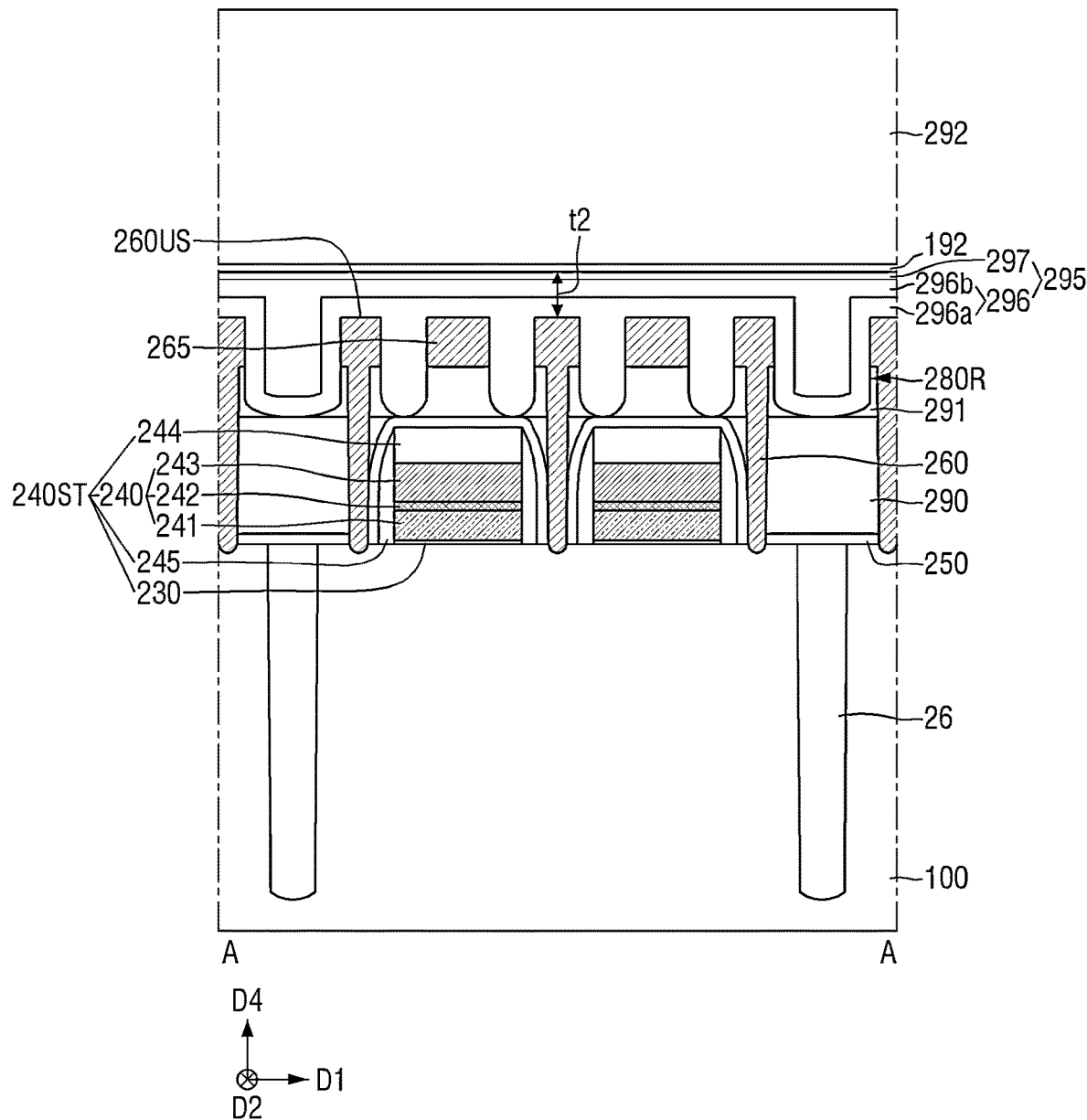
FIGS. 16 and 17 are diagrams for explaining the semiconductor memory device according to some example embodiments.
Figure 17:
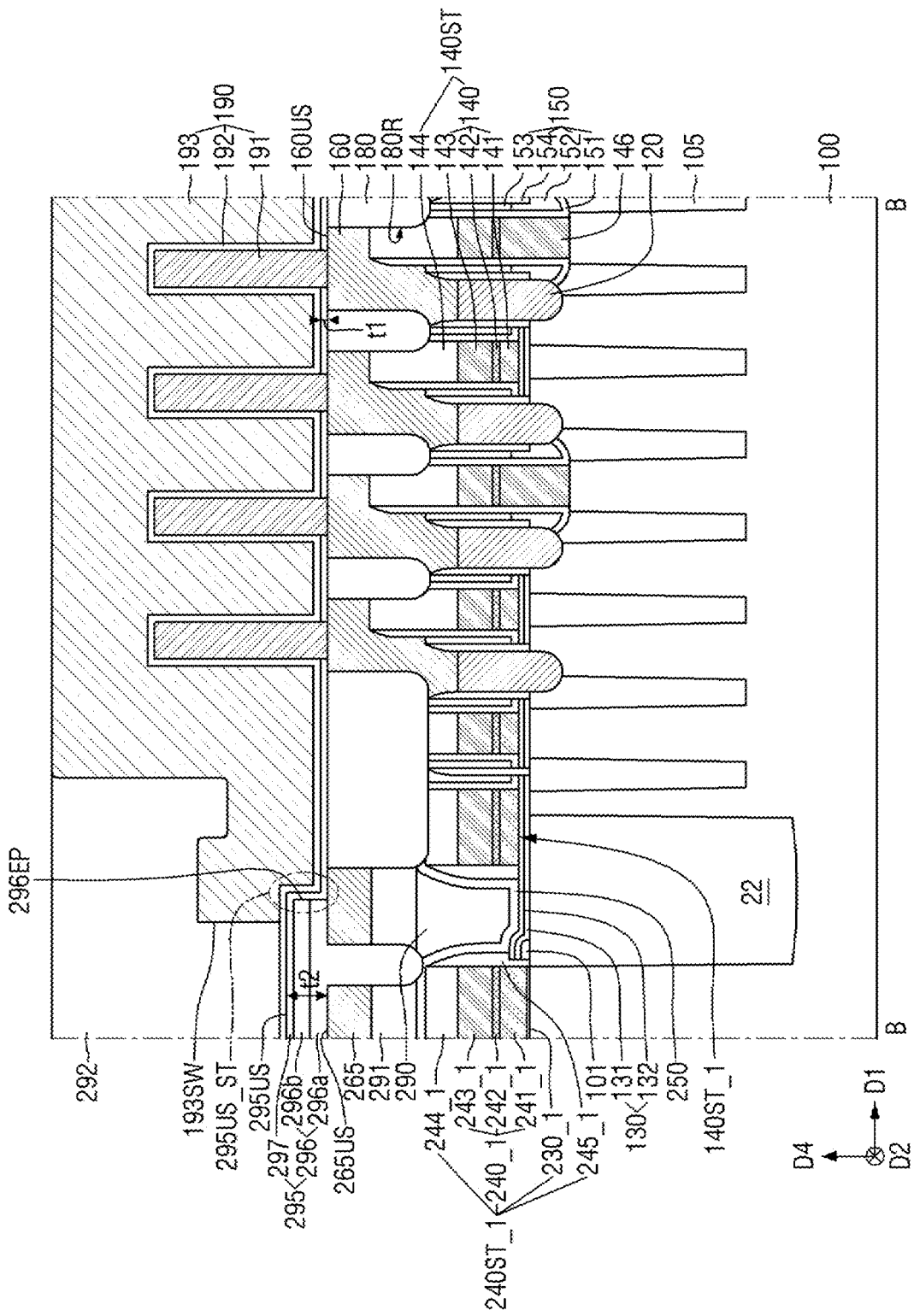
Figure 18:
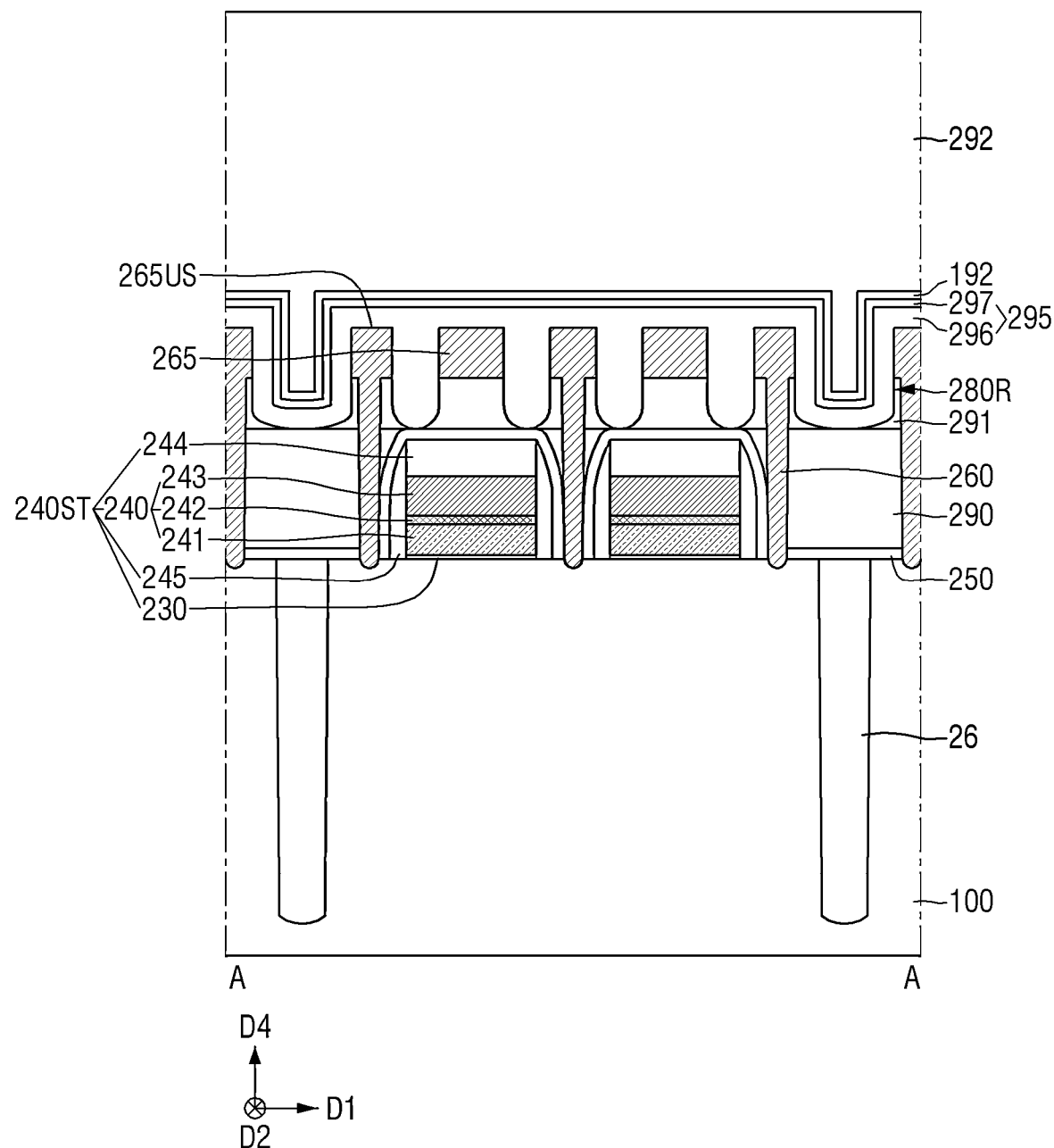
FIG. 18 is a diagram for explaining the semiconductor memory device according to some example embodiments.

FIGS. 16 and 17 are diagrams for explaining a semiconductor memory device according to some example embodiments. FIG. 18 is a diagram for explaining the semiconductor memory device according to some example embodiments. For convenience of explanation, different points from those described using FIGS. 1-3, 4A, 4B, 5 and 6 will be mainly described.

Referring to FIGS. 16 and 17, in the semiconductor memory device according to some example embodiments, the first lower interlayer insulating film 296 may include a plurality of insulating films 296a and 296b sequentially stacked on the substrate 100.

The first lower interlayer insulating film 296 may include a first_1 lower interlayer insulating film 296a, and a first_2 lower interlayer insulating film 296b on the first_1 lower interlayer insulating film 296a.

The first_1 lower interlayer insulating film 296a and the first_2 lower interlayer insulating film 296b may be placed on the upper surface 260US of the peri contact plug and the upper surface 265US of the peri wiring line. The first_1 lower interlayer insulating film 296a and the first_2 lower interlayer insulating film 296b are not placed on the upper surface 160US of the storage pad. The first_1 lower interlayer insulating film 296a and the first_2 lower interlayer insulating film 296b cover the upper surface 260US of the peri contact plug and the upper surface 265US of the peri wiring line. The first_1 lower interlayer insulating film 296a and the first_2 lower interlayer insulating film 296b do not cover the upper surface 160US of the storage pad.

Although the first lower interlayer insulating film 296 is shown to include two insulating films, this is only for convenience of explanation, and example embodiments are not limited thereto.

Referring to FIG. 18, in the semiconductor memory device according to some example embodiments, a part of the wiring separation recess 280R is not filled with the first lower interlayer insulating film 296 and the first upper interlayer insulating film 297.

In the wiring separation recess 280R, a spaced, which is not filled with the first lower interlayer insulating film 296 and the first upper interlayer insulating film 297, may be filled with the first capacitor dielectric film 192 and/or the second interlayer insulating film 292.

Example embodiments are not limited to those described above. Furthermore none of the above-described example embodiments are necessarily mutually exclusive with one another. For example, some example embodiments may include some features described with reference to one figure, and may further include other features described with reference to another figure.

Figure 19:
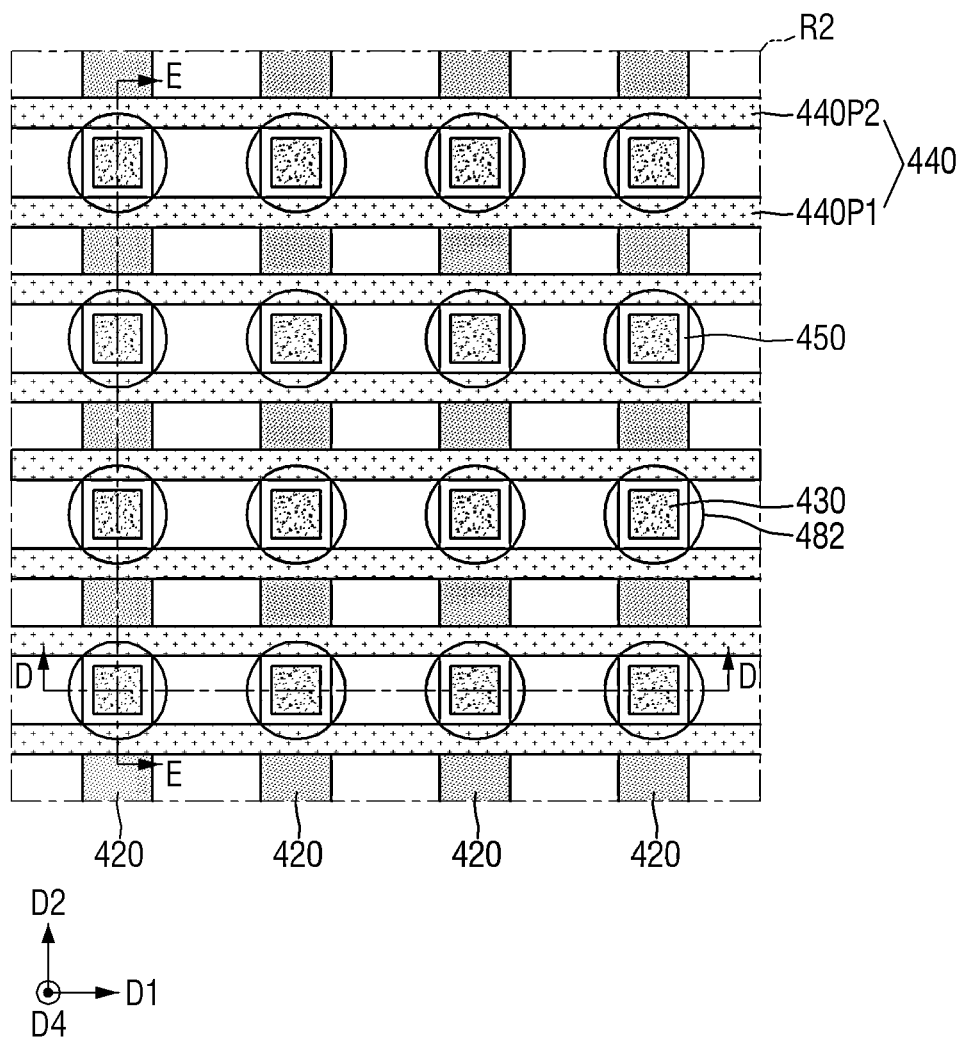
FIG. 19 is a layout diagram for explaining the semiconductor memory device according to some example embodiments.
Figure 20:
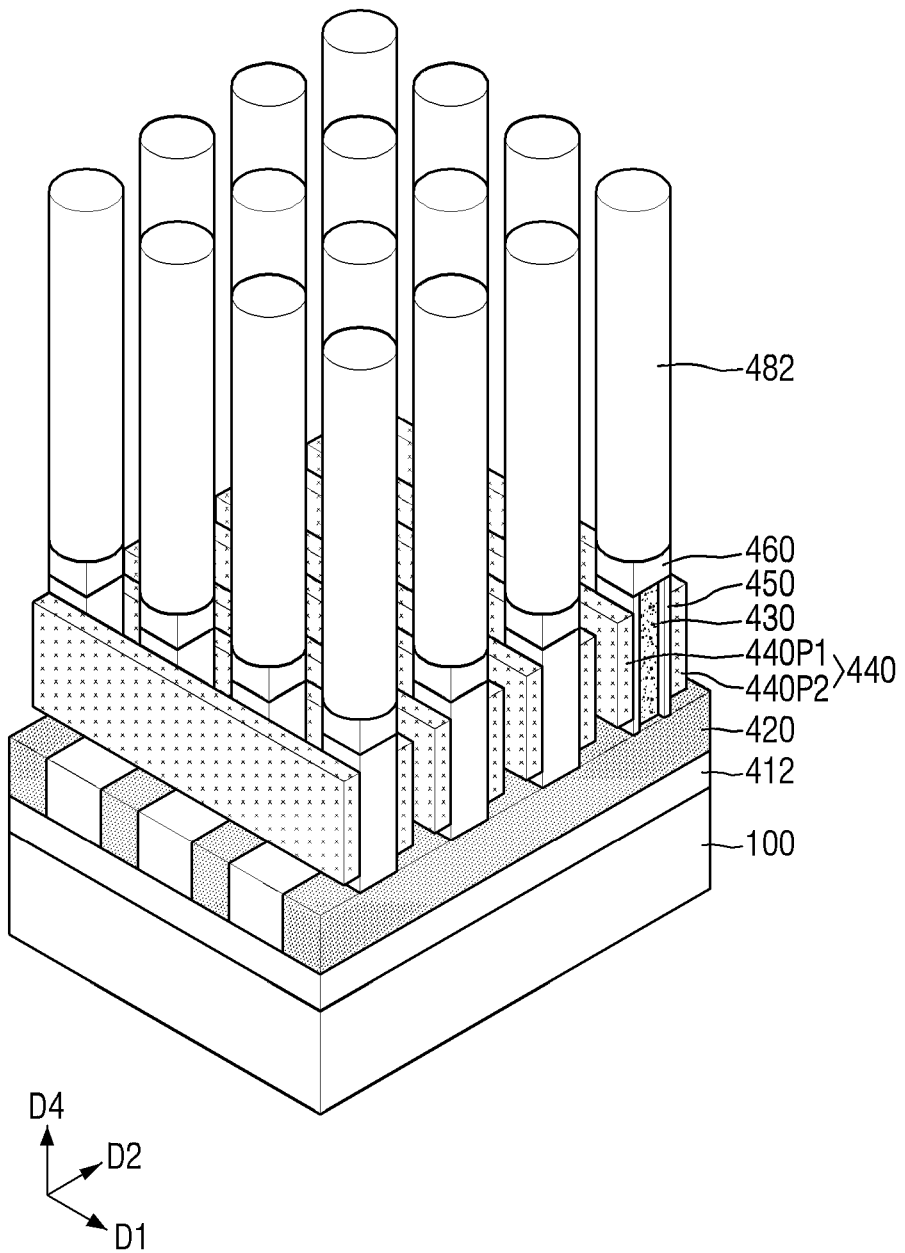
FIG. 20 is a perspective view for explaining the semiconductor memory device according to some example embodiments.
Figure 21:
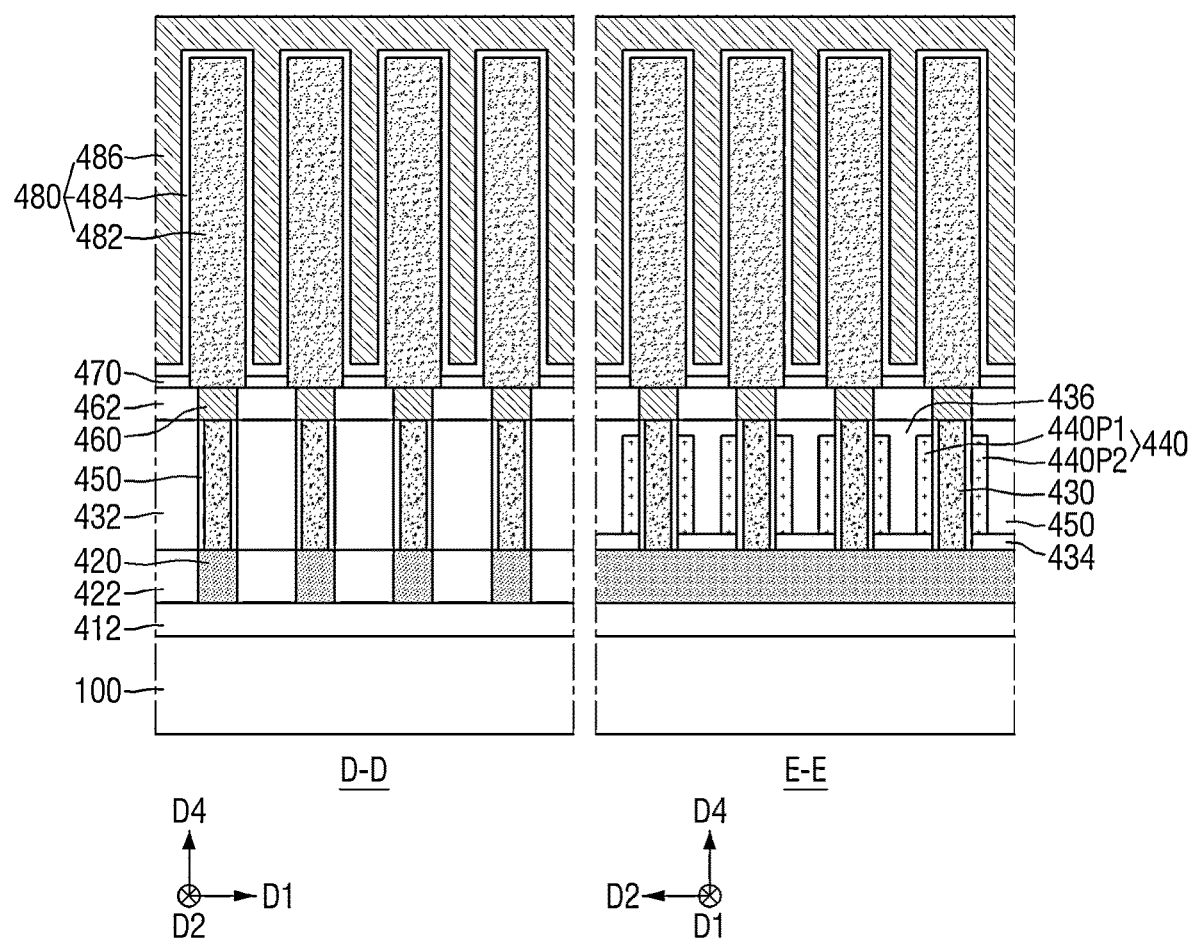
FIG. 21 is a cross-sectional view taken along D-D and E-E of FIG. 19.

FIG. 19 is a layout diagram for explaining a semiconductor memory device according to some example embodiments. FIG. 20 is a perspective view for explaining the semiconductor memory device according to some example embodiments. FIG. 21 is a cross-sectional view taken along D-D and E-E of FIG. 19.

For reference, FIG. 19 may be an enlarged view of the region R1 (the cell region) of FIG. 1. Further, in the semiconductor memory device in which FIG. 19 is applied to the cell region, the cross section (for example, B-B of FIG. 3) of the boundary portion of the cell region is different from that of FIG. 5.

Referring to FIGS. 19 to 21, the semiconductor memory device according to some example embodiments may include a substrate 100, a plurality of first conductive lines 420, a channel layer 430, a gate electrode 440, a gate insulator film 450, and a capacitor 480. The semiconductor memory device according to some example embodiments may be a memory device that includes a vertical channel transistor (VCT). The vertical channel transistor may refer to a structure in which a channel length of the channel layer 430 extends from the substrate 100 along the vertical direction.

A lower insulating layer 412 may be placed on the substrate 100. A plurality of first conductive lines 420 on the lower insulating layer 412 may be spaced apart from each other in the first direction D1 and extend in the second direction D2. A plurality of first insulating patterns 422 may be placed on the lower insulating layer 412 to fill the space between the plurality of first conductive lines 420. The plurality of first insulating patterns 422 may extend in the second direction D2. The upper surface of the plurality of first insulating patterns 422 may be placed at the same level as the upper surface of the plurality of first conductive lines 420. The plurality of first conductive lines 420 may function as/correspond to bit lines.

The plurality of first conductive lines 420 may include a doped semiconductor material such as doped polysilicon, a metal, a conductive metal nitride, a conductive metal silicide, a conductive metal oxide, or a combination thereof. For example, the plurality of first conductive lines 420 may be made up of, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. The plurality of first conductive lines 420 may include a single layer or multi-layers of the aforementioned materials. In the example embodiments, the plurality of first conductive lines 420 may include graphene, carbon nanotube, or a combination thereof.

The channel layer 430 may be arranged in a matrix form that is spaced apart in the first direction D1 and the second direction D2 on the plurality of first conductive lines 420. The channel layer 430 may have a first width along the first direction D1 and a first height along the fourth direction D4, and the first height may be greater than the first width. Here, the fourth direction D4 intersects the first direction D1 and the second direction D2, and may be, for example, a direction perpendicular to the upper surface of the substrate 100. For example, the first height may be, but is not limited to, about 2 to 10 times the first width. A bottom portion of the channel layer 430 functions as/corresponds to a third source/drain region (not shown), an upper portion of the channel layer 430 functions as/corresponds to a fourth source/drain region (not shown), and a part of the channel layer 430 between the third and fourth source/drain regions may function as a channel region (not shown).

In the example embodiments, the channel layer 430 may include an oxide semiconductor, and the oxide semiconductor may include, for example, $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$ or a combination thereof. The channel layer 430 may include a single layer or multi-layers of the oxide semiconductor. In some example embodiments, the channel layer 430 may have a bandgap energy greater than a bandgap energy of silicon. For example, the channel layer 430 may have a bandgap energy of about 1.5 eV to 5.6 eV. For example, the channel layer 430 may have optimum channel performance when it has a bandgap energy of about 2.0 eV to 4.0 eV. For example, the channel layer 430 may be, but is not limited to, polycrystalline or amorphous. In example embodiments, the channel layer 430 may include graphene, carbon nanotube, or a combination thereof.

The gate electrode 440 may extend in the first direction D1 on both side walls of the channel layer 430. The gate electrode 440 has a first subgate electrode 440P1 facing a first side wall of the channel layer 430, and a second subgate electrode 440P2 facing a second side wall opposite to the first side wall of the channel layer 430. Since a single channel layer 430 is placed between the first subgate electrode 440P1 and the second subgate electrode 440P2, the semiconductor device may have a dual gate transistor structure. However, the technical idea of some example embodiments is not limited thereto. The second subgate electrode 440P2 is omitted, and only the first subgate electrode 440P1 facing the first side wall of the channel layer 430 may be formed to implement a single gate transistor structure. The material included in the gate electrode 440 may be the same as the explanation of the cell gate electrode 112.

The gate insulating film 450 surrounds the side walls of the channel layer 430, and may be interposed between the channel layer 430 and the gate electrode 440. For example, as shown in FIG. 19, the entire side walls of the channel layer 430 may be surrounded by the gate insulating film 450, and a part of the side walls of the gate electrode 440 may be in contact with the gate insulating film 450. In some example embodiments, the gate insulating film 450 extends in an extension direction (i.e., the first direction D1) of the gate electrode 440, and among the side walls of the channel layer 430, only two side walls facing the gate electrode 440 may be in contact with the gate insulating film 450. In example embodiments, the gate insulating film 450 may be made up of a silicon oxide film, a silicon oxynitride film, a high dielectric constant material having a higher dielectric constant than the silicon oxide film, or a combination thereof.

A plurality of second insulating patterns 432 may extend along the second direction D2 on the plurality of first insulating patterns 422. The channel layer 430 may be placed between the two adjacent second insulating patterns 432 among the plurality of second insulating patterns 432. Further, between the two adjacent second insulating patterns 432, a first buried layer 434 and a second buried layer 436 may be placed in a space between the two adjacent channel layers 430. The first buried layer 434 may be placed at the bottom portion of the space between the two adjacent channel layers 430. The second buried layer 436 may be formed to fill the rest of the space between the two adjacent channel layers 430 on the first buried layer 434. The upper surface of the second buried layer 436 is located at the same level as the upper surface of the channel layer 430, and the second buried layer 436 may cover the upper surface of the second gate electrode 440. In contrast, a plurality of second insulating patterns 432 are formed of a material layer that is continuous with a plurality of first insulating patterns 422, or the second buried layer 436 may also be formed of a material layer that is continuous with the first buried layer 434.

A capacitor contact 460 may be placed on the channel layer 430. The capacitor contact 460 is placed to vertically overlap the channel layer 430, and may be in a matrix form that is spaced apart in the first direction D1 and the second direction D2. The capacitor contact 460 may be made up of, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. The upper insulating layer 462 may surround the side walls of the capacitor contact 460 on a plurality of second insulating patterns 432 and second buried layers 436.

A cell etching stop film 470 may be placed on the upper insulating layer 462. A capacitor 480 may be placed on the cell etching stop film 470. The cell etching stop film 470 may correspond to the first upper interlayer insulating film 297 of FIG. 6.

The capacitor 480 may include a second lower electrode 482, a second capacitor dielectric film 484, and a second upper electrode 486. The second lower electrode 482 may penetrate the cell etching stop film 470 and be electrically connected to the upper surface of the capacitor contact 460. The second lower electrode 482 may be formed, but is not limited to, in a pillar type that extends in the fourth direction D4. In example embodiments, the second lower electrode 482 is placed to vertically overlap the capacitor contact 460, and may be arranged in a matrix form that is spaced apart in the first direction D1 and the second direction D2. Unlike this, a landing pad (not shown) may be further placed between the capacitor contact 460 and the second lower electrode 482, and the second lower electrode 482 may be arranged in a hexagonal shape.

Figure 22:
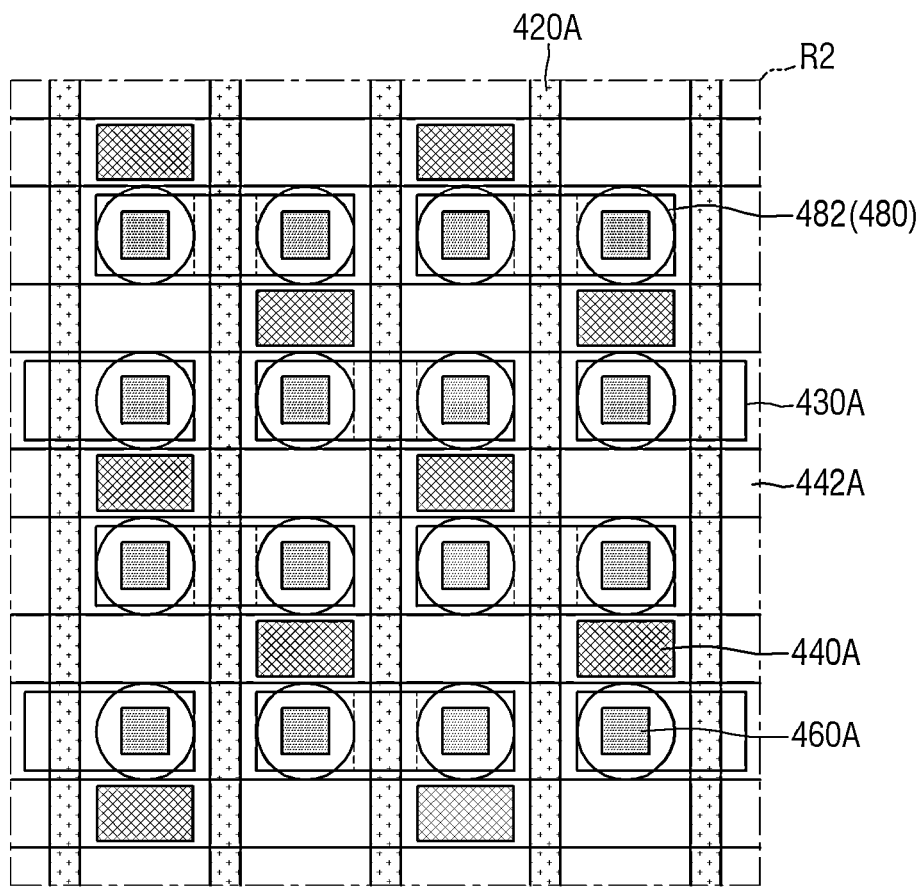
FIG. 22 is a layout diagram for explaining the semiconductor memory device according to some example embodiments.
Figure 23:
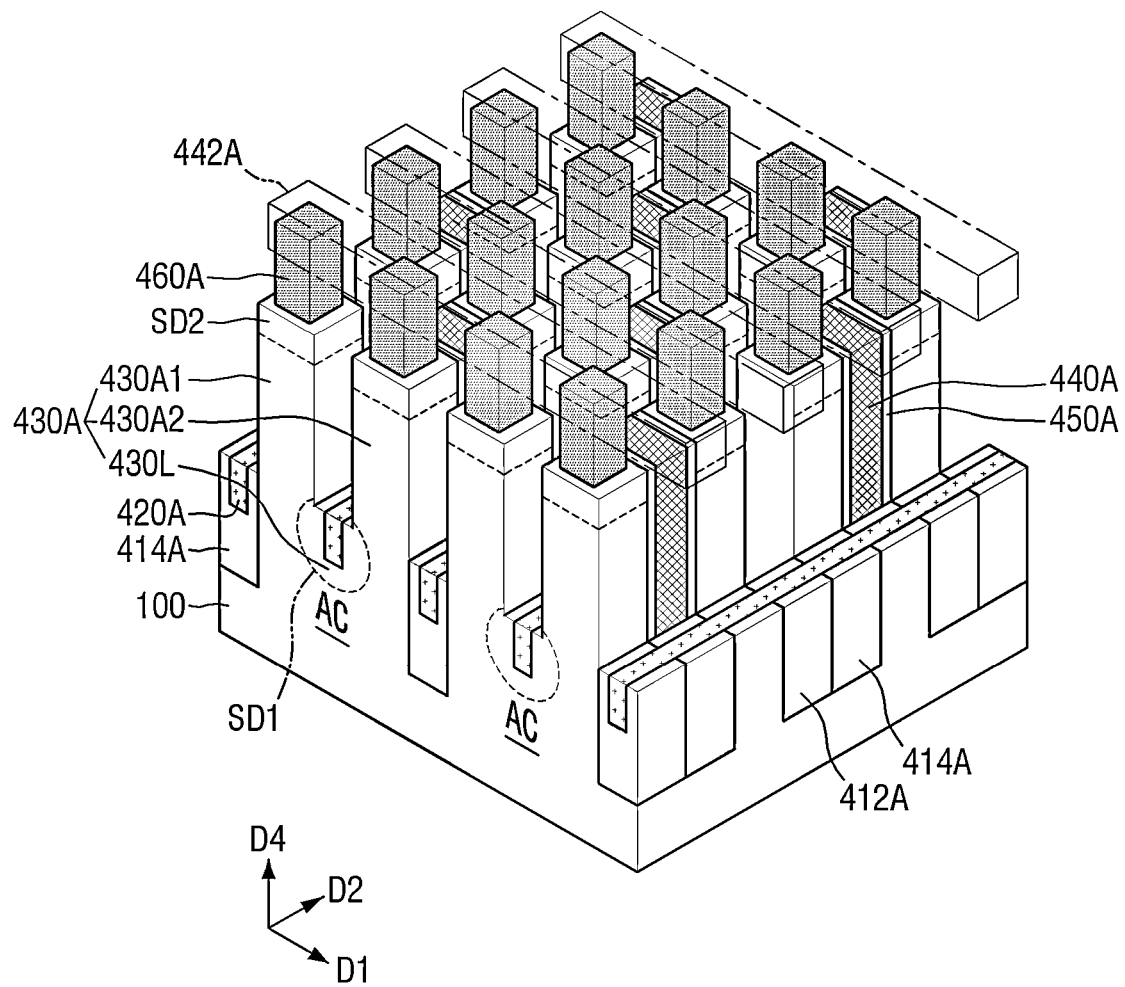
FIG. 23 is a perspective view for explaining the semiconductor memory device according to some example embodiments.
Figure 24A:
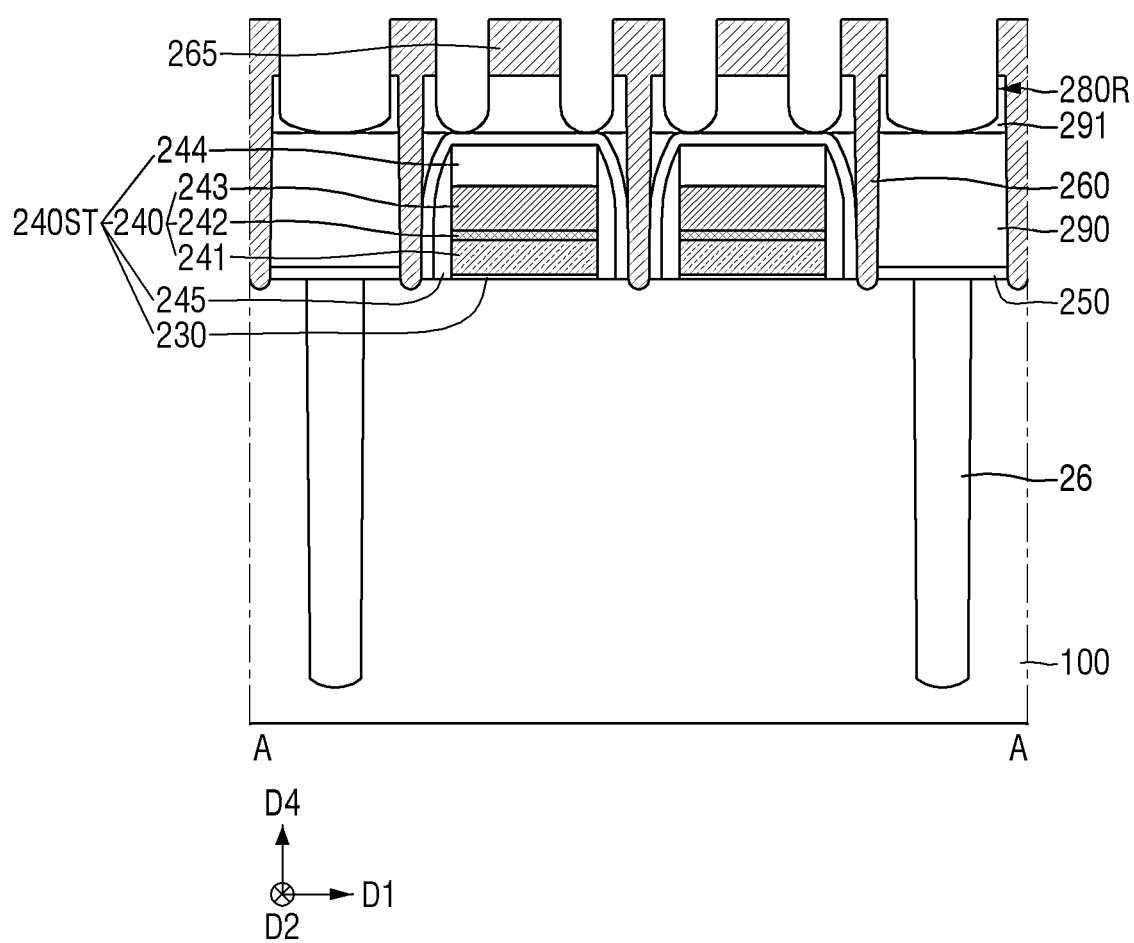
FIGS. 24A to 27B are intermediate stage diagrams for explaining a method for fabricating the semiconductor memory device according to some example embodiments.
Figure 24B:
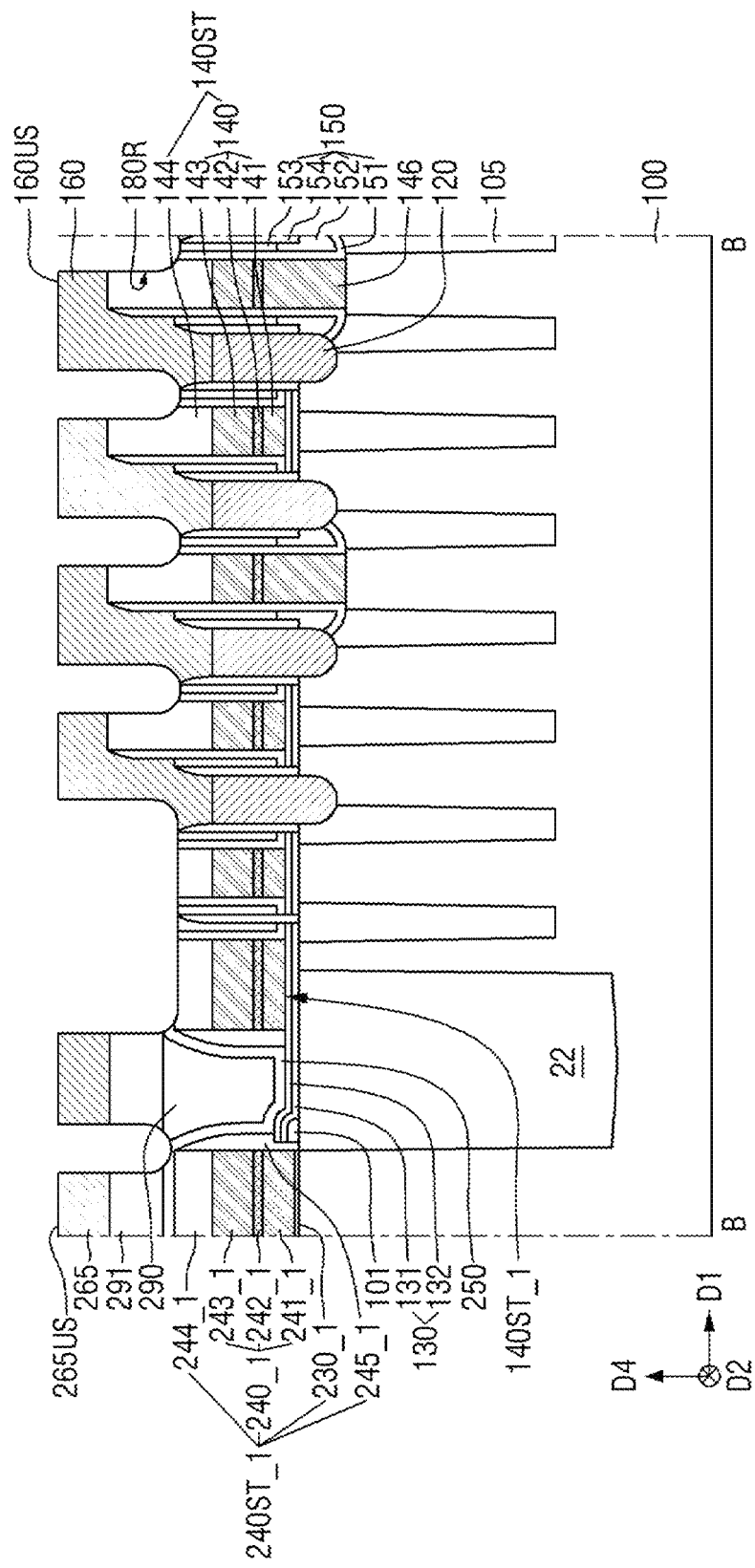

FIG. 22 is a layout diagram for explaining the semiconductor memory device according to some example embodiments. FIG. 23 is a perspective view for explaining the semiconductor memory device according to some example embodiments.

Referring to FIGS. 22 and 23, the semiconductor memory device according to some example embodiments may include a substrate 100, a plurality of first conductive lines 420A, a channel structure 430A, a contact gate electrode 440A, and a plurality second conductive lines 442A and capacitors 480. The semiconductor memory device according to some example embodiments may be a memory device that includes a vertical channel transistor VCT.

A plurality of active regions AC may be defined on the substrate 100 by the first element separation pattern 412A and the second element separation pattern 414A. The channel structure 430A may be placed inside each active region AC. The channel structure 430A may include a first active pillar 430A1 and a second active pillar 430A2 each extending vertically, and a connection 430L connected to a bottom portion of the first active pillar 430A1 and a bottom portion of the second active pillar 430A2, respectively. A first source/drain region SD1 may be placed inside the connection 430L. A second source/drain region SD2 may be placed at the upper side of the first and second active pillars 430A1 and 430A2. The first active pillar 430A1 and the second active pillar 430A2 may each form independent unit memory cell.

The plurality of first conductive lines 420A may extend in a direction that intersects each of the plurality of active regions AC, and may extend, for example, in a second direction D2. One first conductive line 420A among the plurality of first conductive lines 420A may be placed on the connection 430L between the first active pillar 430A1 and the second active pillar 430A2. One first conductive line 420A may be placed on the first source/drain region SD1. The other first conductive line 420A adjacent to one first conductive line 420A may be placed between the two channel structures 430A. One first conductive line 420A among the plurality of first conductive lines 420A may function as a common bit line included in two unit memory cells formed by the first active pillar 430A1 and the second active pillar 430A2 placed on both sides of one first conductive line 420A.

One contact gate electrode 440A may be placed between the two channel structures 430A adjacent to each other in the second direction D2. For example, a contact gate electrode 440A may be placed between the first active pillar 430A1 included in one channel structure 430A and the second active pillar 430A2 of the channel structure 430A adjacent thereto. One contact gate electrode 440A may be shared by the first active pillar 430A1 and the second active pillar 430A2 placed on both side walls thereof. A gate insulating film 450A may be placed between the contact gate electrode 440A and the first active pillar 430A1, and between the contact gate electrode 440A and the second active pillar 430A2. The plurality of second conductive lines 442A may extend in the first direction D1 on the upper surface of the contact gate electrode 440A. The plurality of second conductive lines 442A may function as word lines of the semiconductor device.

A capacitor contact 460A may be placed on the channel structure 430A. The capacitor contact 460A may be placed on the second source/drain region SD2, and the capacitor 480 may be placed on the capacitor contact 460A.

FIGS. 24A to 27B are intermediate stage diagrams for explaining a method for manufacturing/fabricating the semiconductor memory device according to some example embodiments. In the description of the fabricating method, repeated contents of those explained using FIGS. 1-3, 4A, 4B, and 5-18 will be briefly explained or omitted.

Referring to FIGS. 1 to 3, 24A and 24B, a substrate 100 including a cell region 20, a peri region 24, and a cell region separation film 22 is provided.

The cell gate structure 110 may be formed inside the substrate 100 of the cell region 20. The cell gate structure 110 may extend long in the first direction D1. The cell gate structure 110 may include a cell gate trench 115, a cell gate insulating film 111, a cell gate electrode 112, a cell gate capping pattern 113, and a cell gate capping conductive film 114.

Subsequently, the cell insulating film 130 may be formed on the cell region 20. The cell insulating film 130 may expose the substrate 100 of the peri region 24. The cell insulating film 130 may be formed with an oxidation process and/or with a deposition process such as a chemical vapor deposition process.

Subsequently, a bit line structure 140ST may be formed on the substrate 100 of the cell region 20. The bit line structure 140ST may include a cell conductive line 140 and a cell line capping film 144. The cell conductive line 140 may be formed with a chemical vapor deposition (CVD) process and/or with a physical vapor deposition (PVD) process. The cell capping film 144 may be formed with a CVD process.

A peri gate structure 240ST may be formed on the substrate 100 of the peri region 24. The peri gate structure 240ST may include a peri gate insulating film 230, a peri gate conductive film 240, a peri capping film 244, and a peri spacer 245. The peri gate structure 240ST may be formed with one or more oxidation processes, one or more CVD processes, and/or one or more PVD processes.

Subsequently, a storage pad 160 placed on the side surface of the bit line structure 140ST may be formed. The storage pad 160 may be separated by the pad separation recess 180R. Also, the pen contact plugs 260 placed on both sides of the peri gate structure 240ST may be formed. A pen wiring line 265 may be formed on the pen gate structure 240ST. The peri contact plug 260 and the peri wiring line 265 may be separated by a wiring separation recess 280R. There may be one or more of an oxidation process, one or more of a CVD process, and/or one or more of a PVD process.

For example, the storage pad 160, the peri contact plug 260 and the peri wiring line 265 may be formed at the same time.

Figure 25A:
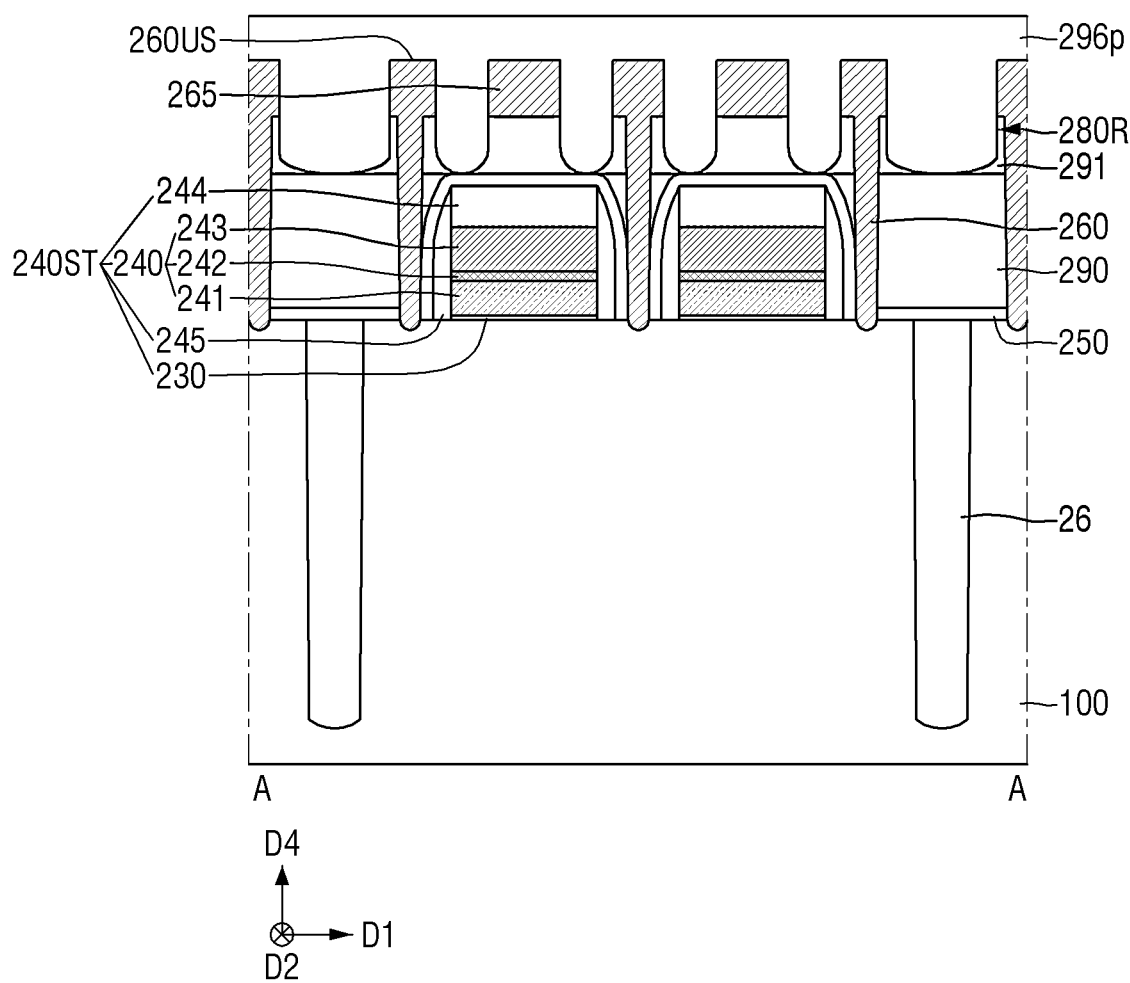
Figure 25B:
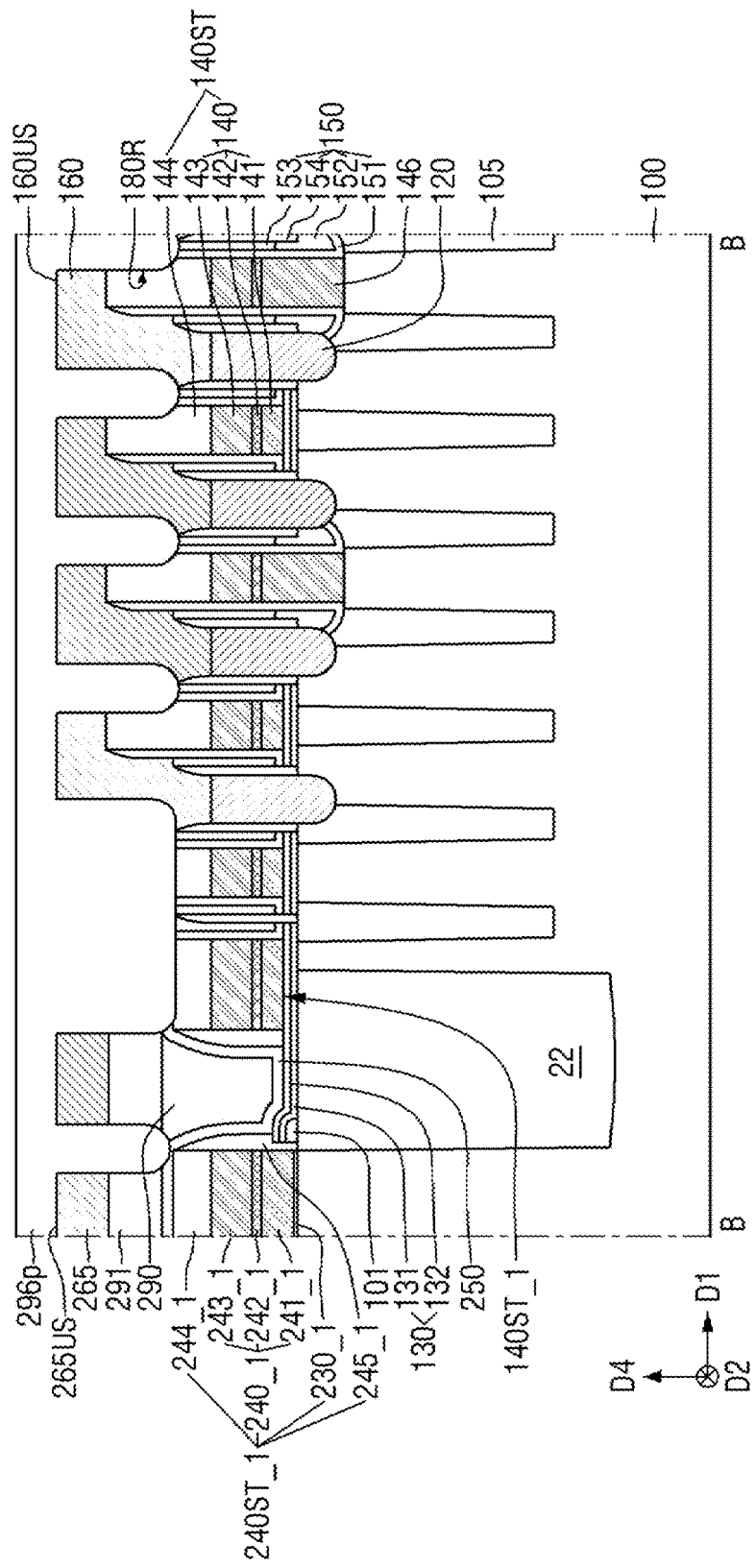

Referring to FIGS. 25A and 25B, a pre lower interlayer insulating film 296p may be formed on the storage pad 160, the peri contact plug 260, and the peri wiring line 265.

The pre lower interlayer insulating film 296p covers the upper surface 260US of the peri contact plug, the upper surface 265US of the peri wiring line, and the upper surface 160US of the storage pad. The pre lower interlayer insulating film 296p may fill the pad separation recess 180R and the wiring separation recess 280R.

Figure 26A:
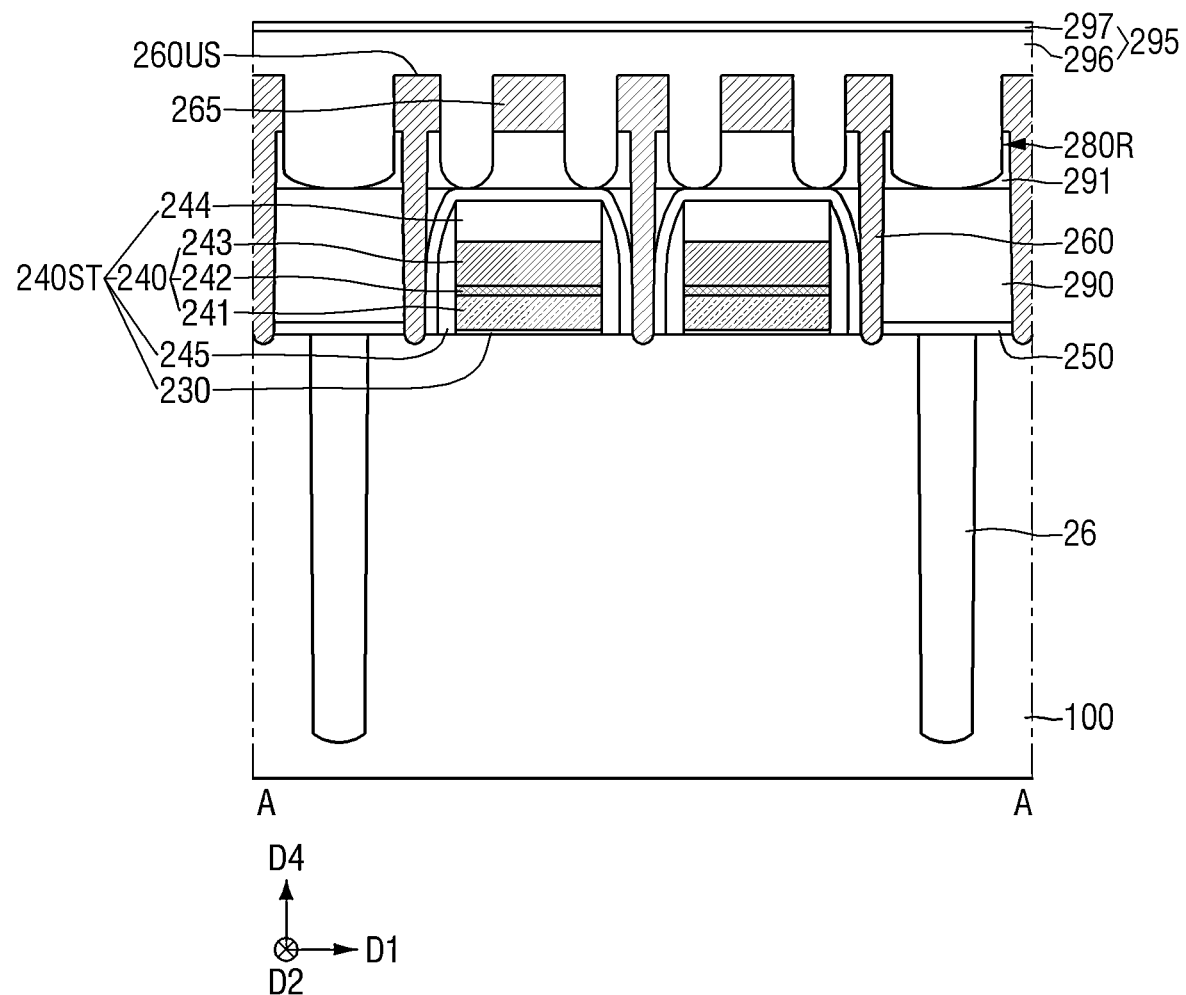
Figure 26B:
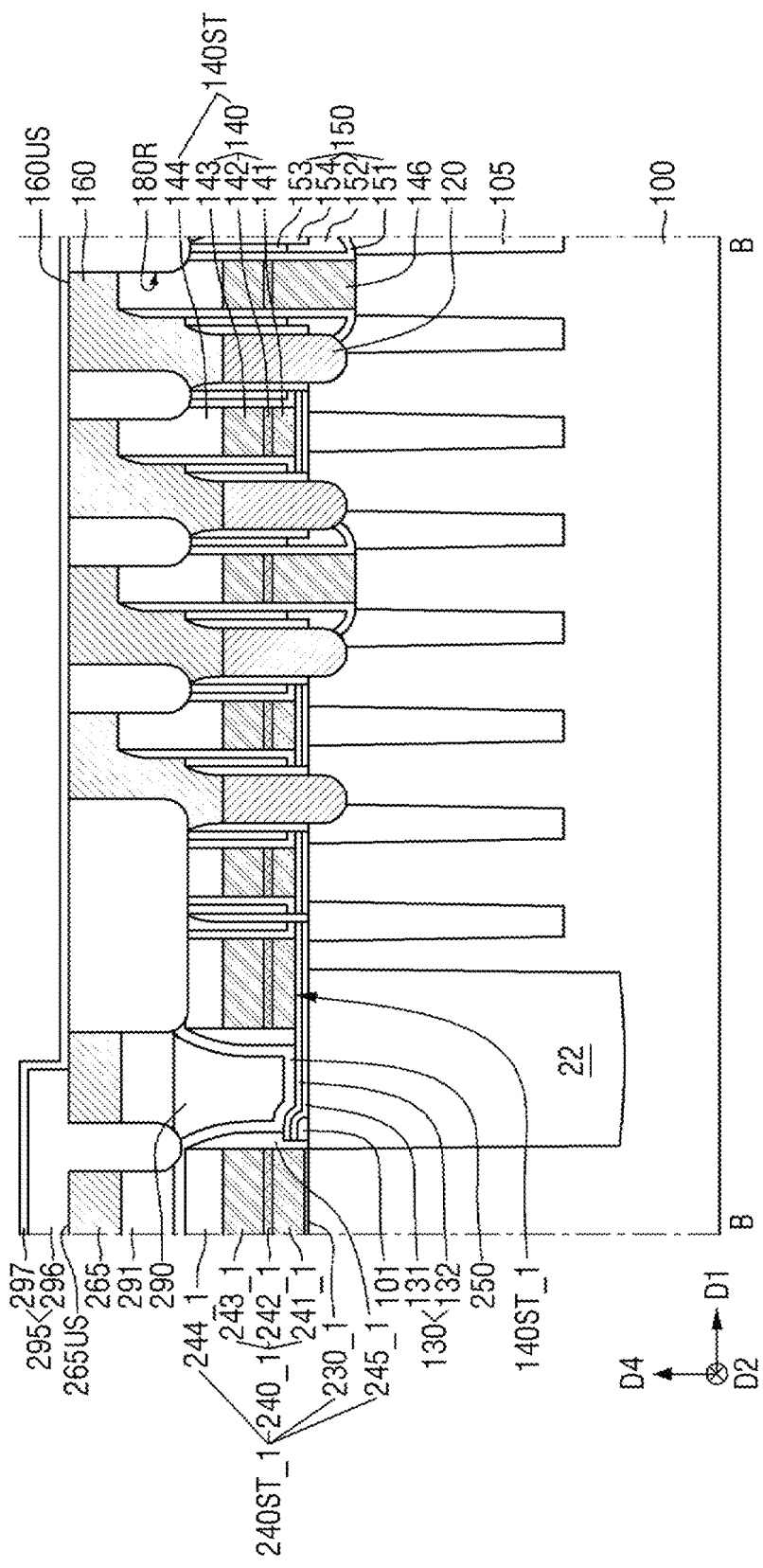

Referring to FIGS. 26A and 26B, by removing a part of the pre lower interlayer insulating film 296p, a first lower interlayer insulating film 296 that exposes the upper surface 160US of the storage pad may be formed.

The first lower interlayer insulating film 296 may cover the upper surface 260US of the peri contact plug and the upper surface 265US of the peri wiring line.

While the first lower interlayer insulating film 296 is being formed, the pad separation insulating film 180 is formed in the pad separation recess 180R.

Subsequently, a first upper interlayer insulating film 297 that covers the cell region 20, the peri region 24, and the cell region separation film 22 is formed on the first lower interlayer insulating film 296. As a result, the first interlayer insulating film 295 is formed.

The first upper interlayer insulating film 297 may be an upper etching stop film. The first upper interlayer insulating film 297 covers the upper surface 160US of the storage pad exposed by the first lower interlayer insulating film 296.

Figure 27A:
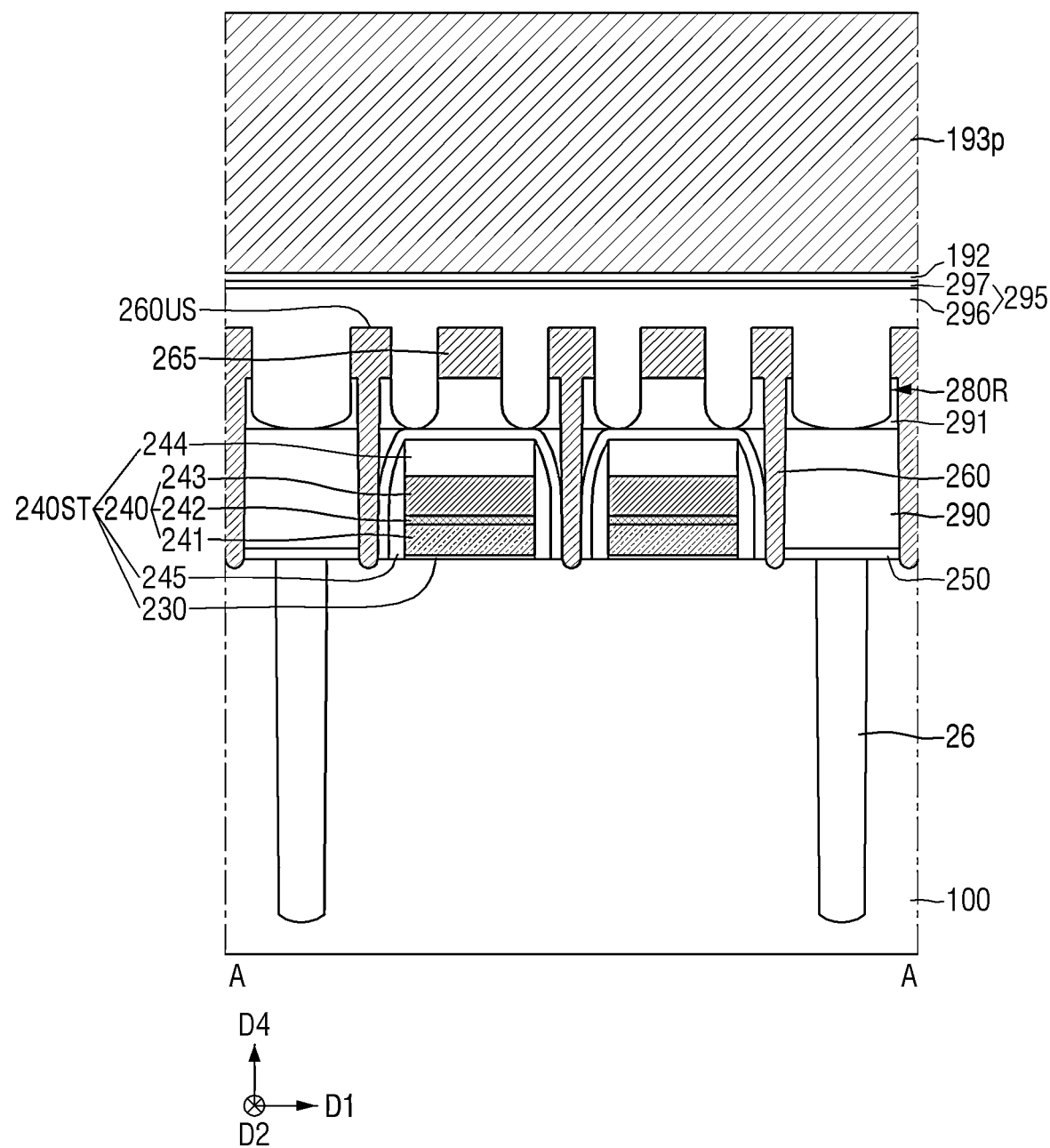
Figure 27B:
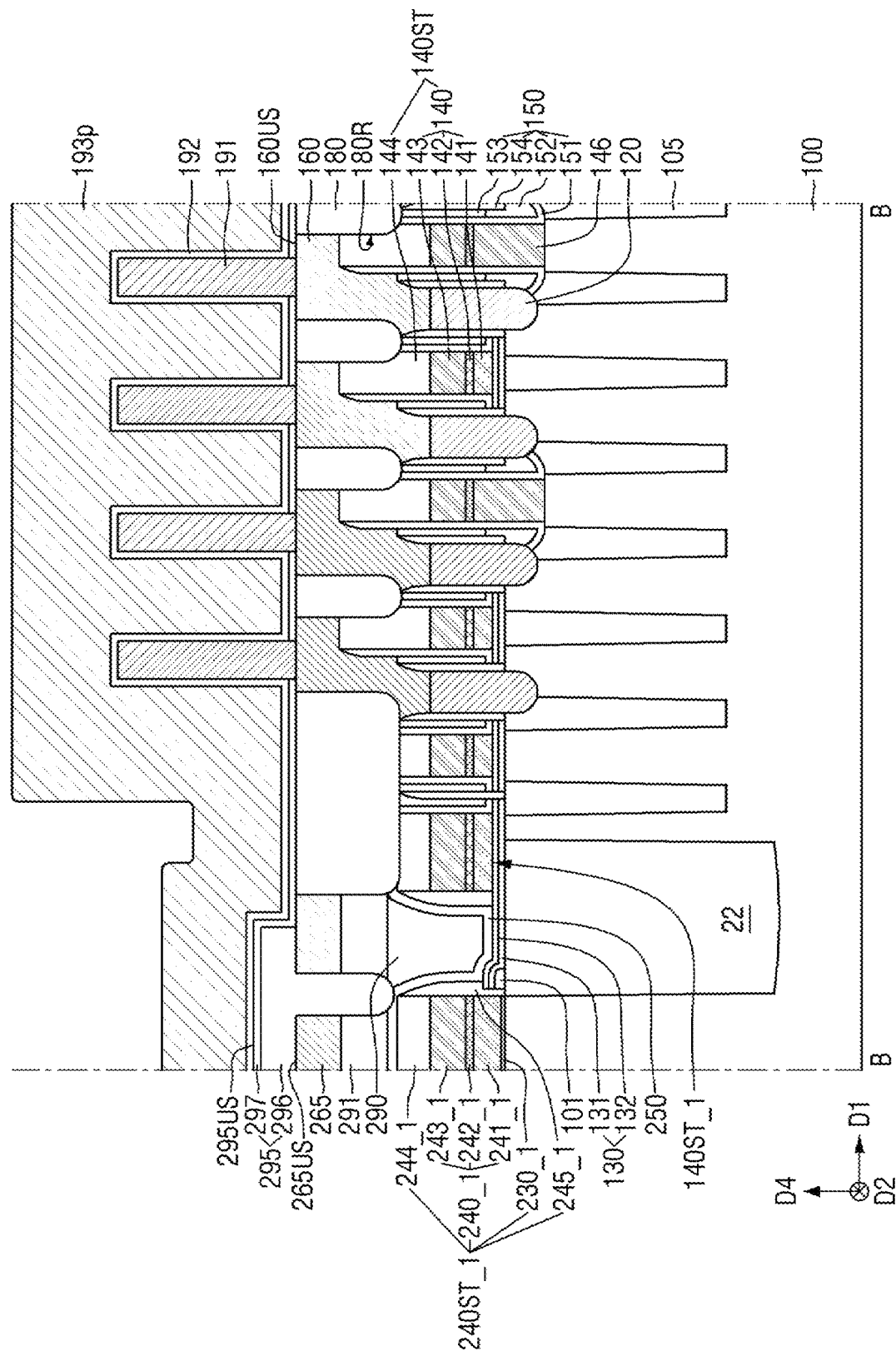

Referring to FIGS. 27A and 27B, a first lower electrode 191 that penetrates the first upper interlayer insulating film 297 may be formed. The first lower electrode 191 is connected to the storage pad 160.

Subsequently, the first capacitor dielectric film 192 is formed on the first lower electrode 191. The first capacitor dielectric film 192 may be formed along the profile of the first lower electrode 191.

Subsequently, a pre upper electrode 193p is formed on the first capacitor dielectric film 192. The pre upper electrode 193p may cover the cell region 20, the peri region 24, and the cell region separation film 22.

Subsequently, the pre upper electrode 193p may be patterned to form the first upper electrode (193 of FIG. 5).

In concluding the detailed description, those of ordinary skill in the art will appreciate that many variations and/or modifications and/or additions and/or deletions may be made to example embodiments without substantially departing from the principles of some example embodiments. Therefore, example embodiments of the disclosure are used in a generic and descriptive sense only and not for purposes of limitation.

What is claimed is:

1. A semiconductor memory device, comprising:
 a substrate including a cell region and a peri region around the cell region, the cell region including an active region defined by an element separation film;
 a storage pad connected to the active region of the cell region; a peri gate structure on the substrate of the peri region;
 a peri contact plug on both sides of the peri gate structure and electrically connectable to the substrate;
 a first interlayer insulating film on the storage pad and on the peri contact plug, and including a nitride-based insulating material; and
 an information storage circuit connected to the storage pad,
 wherein a thickness of the first interlayer insulating film on an upper surface of the storage pad is less than a thickness of the first interlayer insulating film on an upper surface of the peri contact plug,
 wherein the first interlayer insulating film is on and over the upper surface of the peri contact plug, and
 wherein the first interlayer insulating film includes a lower interlayer insulating film, the lower interlayer insulating is on and over the upper surface of the peri contact plug and is not on the upper surface of the storage pad.

2. The semiconductor memory device of claim 1, wherein the first interlayer insulating film further includes an upper interlayer insulating film on the lower interlayer insulating film.

3. The semiconductor memory device of claim 2, wherein the upper interlayer insulating film is on the upper surface of the storage pad and the upper surface of the peri contact plug.

4. The semiconductor memory device of claim 1, wherein the information storage circuit includes a lower electrode connected to the storage pad, a capacitor dielectric film on the lower electrode, and a plate upper electrode on the capacitor dielectric film.

5. The semiconductor memory device of claim 4, further comprising:
 a second interlayer insulating film placed on the first interlayer insulating film and covering side walls of the plate upper electrode,
 wherein the second interlayer insulating film directly contacts the first interlayer insulating film.

6. The semiconductor memory device of claim 4, further comprising:
 a second interlayer insulating film on the first interlayer insulating film and covering side walls of the plate upper electrode,
 wherein the capacitor dielectric film extends along a boundary between the first interlayer insulating film and the second interlayer insulating film.

7. The semiconductor memory device of claim 4, wherein the first interlayer insulating film includes a lower interlayer insulating film, and an upper interlayer insulating film on the lower interlayer insulating film, and
 the lower interlayer insulating film includes a first portion vertically overlapping the plate upper electrode, and a second portion which does not vertically overlap the plate upper electrode.

8. The semiconductor memory device of claim 7, wherein a thickness of a first portion of the lower interlayer insulating film is greater than a thickness of a second portion of the lower interlayer insulating film.

9. The semiconductor memory device of claim 1, wherein an upper surface of a peri wiring line is on a same plane as the upper surface of the storage pad.

10. A semiconductor memory device, comprising:
 a substrate including a cell region and a peri region around the cell region, the cell region including an active region defined by an element separation film;
 a cell separation film defining the cell region in the substrate;
 a storage pad connected to the active region of the cell region;
 a peri gate structure on the substrate of the peri region;
 a peri contact plug on both sides of the peri gate structure and electrically connectable to the substrate, an upper surface of a peri wiring line on a same plane as an upper surface of the storage pad;
 a first interlayer insulating film on the storage pad and on the peri contact plug and including a nitride-based insulating material; and
 a capacitor including a lower electrode connected to the storage pad, a capacitor dielectric film on the lower electrode, and a plate upper electrode on the capacitor dielectric film, wherein an upper surface of the first interlayer insulating film includes a step structure on the cell separation film,
wherein the first interlayer insulating film is on and over thein upper surface of the peri contact plug, and
wherein a lower interlayer insulating film is on the upper surface of the peri contact plug and is not on the upper surface of the storage pad.

11. The semiconductor memory device of claim 10, wherein a thickness of the first interlayer insulating film on the upper surface of the peri contact plug is greater than a thickness of the first interlayer insulating film on the upper surface of the storage pad.

12. The semiconductor memory device of claim 10, wherein the first interlayer insulating film includes tithe lower interlayer insulating film, and an upper interlayer insulating film on the lower interlayer insulating film,
the lower interlayer insulating film includes a termination on the cell separation film, and
the step structure is defined by the termination of the lower interlayer insulating film.

13. The semiconductor memory device of claim 12, wherein the lower interlayer insulating film includes a plurality of insulating films sequentially stacked on the substrate.

14. The semiconductor memory device of claim 10, wherein the step structure is at a position that vertically overlaps the plate upper electrode.

15. The semiconductor memory device of claim 10, further comprising:
a second interlayer insulating film on the first interlayer insulating film and covering side walls of the plate upper electrode,
wherein the second interlayer insulating film directly contacts the first interlayer insulating film.

16. A semiconductor memory device, comprising:
a substrate including a cell region, and a peri region around the cell region, the cell region including an active region defined by an element separation film;
a cell separation film defining the cell region of the substrate;
a bit line structure including a cell conductive line and a cell line capping film on the cell conductive line, the bit line structure on the substrate of the cell region;
a cell gate electrode placed inside the substrate of the cell region and intersecting the cell conductive line;
a storage pad on a side surface of the bit line structure and connected to the active region of the cell region;
a peri gate structure on the substrate of the peri region;
a peri contact plug on both sides of the peri gate structure and electrically connectable to the substrate;
a capacitor including a lower electrode connected to the storage pad, a capacitor dielectric film on the lower electrode, and a plate upper electrode on the capacitor dielectric film;
a lower interlayer insulating film on the peri contact plug and including a nitride-based insulating material, a termination of the lower interlayer insulating film covered by the plate upper electrode; and
an additional interlayer insulating film on the lower interlayer insulating film and covering side walls of the plate upper electrode,
wherein the lower interlayer insulating film is not on an upper surface of the storage pad.

17. The semiconductor memory device of claim 16, further comprising:
an etching stop film on the upper surface of the storage pad,
wherein the etching stop film extends between the lower interlayer insulating film and the plate upper electrode.

18. The semiconductor memory device of claim 17, wherein the etching stop film extends between the lower interlayer insulating film and the additional interlayer insulating film.

19. The semiconductor memory device of claim 16, wherein the capacitor dielectric film is not between the lower interlayer insulating film and the additional interlayer insulating film.

* * * * *